(12) United States Patent
Yokoyama

(10) Patent No.: US 7,750,423 B2
(45) Date of Patent: Jul. 6, 2010

(54) PHOTOELECTRIC CONVERSION DEVICE, SOLID-STATE IMAGING DEVICE AND MANUFACTURING METHOD OF SOLID-STATE IMAGING DEVICE

(75) Inventor: Daisuke Yokoyama, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 570 days.

(21) Appl. No.: 11/730,434

(22) Filed: Apr. 2, 2007

(65) Prior Publication Data
US 2007/0228503 A1    Oct. 4, 2007

(30) Foreign Application Priority Data
Mar. 31, 2006    (JP) .............................. 2006-100627

(51) Int. Cl.
*H01L 27/142* (2006.01)
(52) U.S. Cl. ................................ 257/431; 257/E31.003
(58) Field of Classification Search .................. 257/431, 257/E31.003
See application file for complete search history.

(56) References Cited

U.S. PATENT DOCUMENTS

| | | | |
|---|---|---|---|
| 6,623,900 B1 * | 9/2003 | Saito | ........................... 430/78 |
| 7,492,028 B2 * | 2/2009 | Nishi et al. | .................. 257/458 |
| 2006/0278944 A1 * | 12/2006 | Rand et al. | .................. 257/431 |

FOREIGN PATENT DOCUMENTS

| | | | |
|---|---|---|---|
| JP | 63300576 A | * | 12/1988 |
| JP | 05343715 A | * | 12/1993 |
| JP | 8-88341 A | | 4/1996 |

* cited by examiner

*Primary Examiner*—Allan R. Wilson
(74) *Attorney, Agent, or Firm*—Sughrue Mion, PLLC

(57) ABSTRACT

A photoelectric conversion device comprising a lower electrode, an upper electrode opposing to the lower electrode and a photoelectric conversion layer provided between the lower electrode and the upper electrode, the photoelectric conversion device being for collecting a photocurrent upon application of a bias voltage between the lower electrode and the upper electrode, wherein the upper electrode works as an electrode in a light incident side, the upper electrode is transparent, and the lower electrode is a metallic electrode having a function to reflect light.

37 Claims, 14 Drawing Sheets

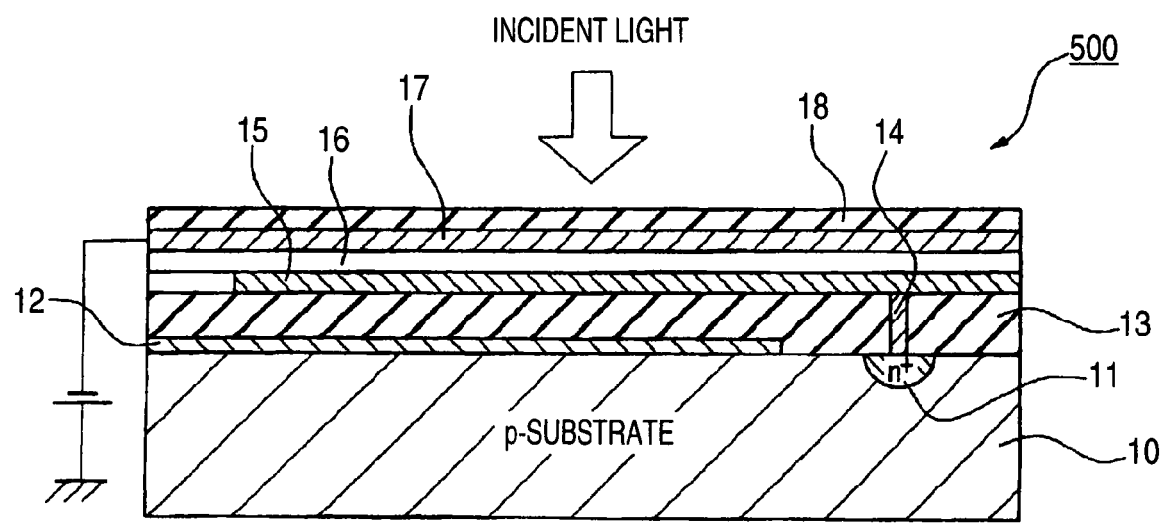

PHOTOELECTRIC CONVERSION DEVICE, SOLID-STATE IMAGING DEVICE AND MANUFACTURING METHOD OF SOLID-STATE IMAGING DEVICE

FIELD OF THE INVENTION

The present invention relates to a photoelectric conversion device including a lower electrode, an upper electrode opposing to the lower electrode and a photoelectric conversion layer provided between the lower electrode and the upper electrode, and the photoelectric conversion device is for collecting a photocurrent upon application of a bias voltage between the lower electrode and the upper electrode.

BACKGROUND OF THE INVENTION

In a usual single-plate solid-state image device, since photodiodes are provided on substantially the same plane as a charge transfer path, there is involved a defect that following high integration of pixels, the photodiodes are hardly waveguided. For that reason, though incident light is condensed into the photodiodes by a microlens or the like, its condensation efficiency is not satisfactory. Furthermore, the condensation efficiency may possibly differ depending upon a light incident angle, resulting in a problem such as shading. In addition, in forming a microlens, there are brought an increase in the number of processes and an increase in costs. In order to obtain a color-separated signal, a color filter is needed, and this brings an increase in the number of processes and an increase in costs, too.

As an imaging device with a high aperture factor, there is proposed an imaging device in which a photoelectric conversion device having an a-Si (amorphous silicon) photoelectric conversion layer interposed between a pair of electrodes is provided on a silicon substrate having a signal read-out circuit formed thereon (see JP-A-8-88341). However, in the a-Si, it is difficult to disperse light in a visible light region with good color separation and a color filter is needed, leading to an increase in costs. Also, for the purpose of desiring sufficient optical absorption, a thickness of several μm of the photoelectric conversion layer is needed, and manufacturing costs by a high-frequency glow discharge decomposition method are high.

SUMMARY OF THE INVENTION

In view of the foregoing background, the invention has been made, and its object is to provide a photoelectric conversion device capable of improving an absorption factor without thickening a photoelectric conversion layer.

The foregoing problems are solved by the following configurations.

(1) A photoelectric conversion device which includes a lower electrode, an upper electrode opposing to the lower electrode and a photoelectric conversion layer formed between the lower electrode and the upper electrode, and which is for collecting a photocurrent upon application of a bias voltage between the lower electrode and the upper electrode, wherein the upper electrode works as an electrode in the light incident side; the upper electrode is transparent; and the lower electrode is a metallic electrode having a function to reflect light.

(2) The photoelectric conversion device as set forth in (1), wherein a transparent electrode is provided between the lower electrode and the photoelectric conversion layer.

(3) The photoelectric conversion device as set forth in (1) or (2), wherein the bias voltage is 0.1 V or more and not more than 30 V.

(4) The photoelectric conversion device as set forth in any one of (1) to (3), wherein the photoelectric conversion layer is configured to include an organic photoelectric conversion material.

(5) The photoelectric conversion device as set forth in (4), wherein the organic photoelectric conversion material contains any one of a material having a quinacridone skeleton, a material having a phthalocyanine skeleton and a material having an anthraquinone skeleton.

(6) The photoelectric conversion device as set forth in any one of (1) to (5), wherein an absorption factor of the whole of the photoelectric conversion device against incident light is 80% or more in an absorption peak wavelength of the photoelectric conversion layer.

(7) The photoelectric conversion device as set forth in any one of (1) to (6), wherein a half value width of an action spectrum of the photoelectric conversion device against incident light is not more than 130 nm.

(8) The photoelectric conversion device as set forth in any one of (1) to (7), wherein a thickness of the photoelectric conversion layer is not more than 100 nm.

(9) The photoelectric conversion device as set forth in any one of (1) to (8), wherein a smoothing layer for reducing roughness of a surface of the photoelectric conversion layer is provided between the photoelectric conversion layer and the upper electrode.

(10) The photoelectric conversion device as set forth in (9), wherein the smoothing layer is made of an amorphous material.

(11) The photoelectric conversion device as set forth in (9) or (10), wherein a mean surface roughness Ra of a surface of the smoothing layer is not more than 1 nm.

(12) The photoelectric conversion device as set forth in any one of (9) to (11), wherein a material constituting the smoothing layer is an organic material.

(13) The photoelectric conversion device as set forth in any one of (9) to (12), wherein the smoothing layer is transparent.

(14) The photoelectric conversion device as set forth in any one of (9) to (13), wherein a thickness of the smoothing layer is from 10 to 200 nm.

(15) The photoelectric conversion device as set forth in any one of (1) to (14), wherein the upper electrode is a thin layer of a transparent conducting oxide.

(16) The photoelectric conversion device as set forth in (15), wherein the transparent conducting oxide is ITO.

(17) The photoelectric conversion device as set forth in any one of (1) to (14), wherein the upper electrode is a metallic thin layer formed by vapor deposition.

(18) The photoelectric conversion device as set forth in any one of (1) to (17), wherein a thickness of the upper electrode is from 5 to 200 nm.

(19) The photoelectric conversion device as set forth in any one of (1) to (18), wherein a mean surface roughness Ra of a surface of the lower electrode is not more than 3 nm.

(20) The photoelectric conversion device as set forth in any one of (1) to (19), wherein the lower electrode works as an electrode for collecting electrons, and the upper electrode works as an electrode for collecting holes.

(21) The photoelectric conversion device as set forth in (20), wherein the smoothing layer is made of a hole transporting material.

(22) The photoelectric conversion device as set forth in (21), wherein the hole transporting material is a material having a triphenylamine structure.

(23) The photoelectric conversion device as set forth in (22), wherein the hole transporting material is a material having a starburst amine structure.

(24) The photoelectric conversion device as set forth in any one of (20) to (23), wherein a work function of the lower electrode is not more than 4.5 eV.

(25) The photoelectric conversion device as set forth in (24), wherein the lower electrode contains a metallic material of any one of Ag, Al, Ca, In, Mg, Mn, Ta, Ti, V and W.

(26) The photoelectric conversion device as set forth in any one of (1) to (19), wherein the lower electrode works as an electrode for collecting holes, and the upper electrode works as an electrode for collecting electrons.

(27) The photoelectric conversion device as set forth in (26), wherein the smoothing layer is made of an electron transporting material.

(28) The photoelectric conversion device as set forth in (27), wherein the electron transporting material is $Alq_3$ or a derivative thereof.

(29) The photoelectric conversion devices as set forth in any one of (26) to (28), wherein a work function of the lower electrode is 4.5 eV or more.

(30) The photoelectric conversion device as set forth in (29), wherein the lower electrode contains a metallic material of any one of Au, Co, Fe, Mo, Pd and Pt.

(31) The photoelectric conversion device as set forth in any one of (26) to (30), wherein a work function of the upper electrode is not more than 4.5 eV.

(32) The photoelectric conversion device as set forth in (31), wherein the upper electrode is Cs-doped ITO.

(33) A solid-state imaging device, which is provided with a number of the photoelectric conversion devices according to any one of (1) to (32), as disposed in an array state on the same plane on the upper side of a semiconductor substrate; and a signal read-out part for reading out a signal corresponding to a signal charge generated in each of the number of photoelectric conversion devices.

(34) The solid-state imaging device as set forth in (33), wherein the signal read-out part is made of a CMOS circuit or CCD formed in the semiconductor substrate.

(35) The solid-state imaging device as set forth in (33) or (34), wherein the number of photoelectric conversion layers contained in each of the number of photoelectric conversion devices each contains plural kinds of photoelectric conversion layers each of which absorbs light of a different wavelength region to generate a charge corresponding thereto.

(36) The solid-state imaging device as set forth in (35), wherein the number of photoelectric conversion layers contained in each of the number of photoelectric conversion devices each contains three kinds of photoelectric conversion layers each of which absorbs light of a different wavelength region to generate a charge corresponding thereto; and the three kinds of photoelectric conversion layers are disposed in a mosaic state.

(37) The solid-state imaging device as set forth in (35), wherein the number of photoelectric conversion layers contained in each of the number of photoelectric conversion devices each contains three kinds of photoelectric conversion layers each of which absorbs light of a different wavelength region to generate a charge corresponding thereto; and the three kinds of photoelectric conversion layers are disposed in a stripe state.

(38) A manufacturing method of the solid-state imaging device as set forth in any one of (35) to (37), which includes a step for vapor depositing materials constituting the photoelectric conversion layers on the same plane on the upper side of the semiconductor substrate via a mask, thereby forming the photoelectric conversion layers.

According to the invention, it is possible to provide a photoelectric conversion device capable of improving an absorption factor without thickening a photoelectric conversion layer.

BRIEF DESCRIPTION OF THE DRAWINGS

FIG. 12 is a schematic cross-sectional view of one pixel of a solid-state imaging device using the photoelectric conversion device described in the first embodiment.

FIGS. 13A and 13B are each a view to show a disposition pattern of the pixel of the solid-state imaging device as illustrated in FIG. 12.

DESCRIPTION OF THE REFERENCE NUMERALS AND SIGNS

1: Substrate
2: Lower electrode
3: Photoelectric conversion layer
4: Upper electrode
5: Smoothing layer
6: Work function adjusting layer

DETAILED DESCRIPTION OF THE INVENTION

Embodiments of the invention are hereunder described with reference to the accompanying drawings.

First Embodiment

Figure 1:
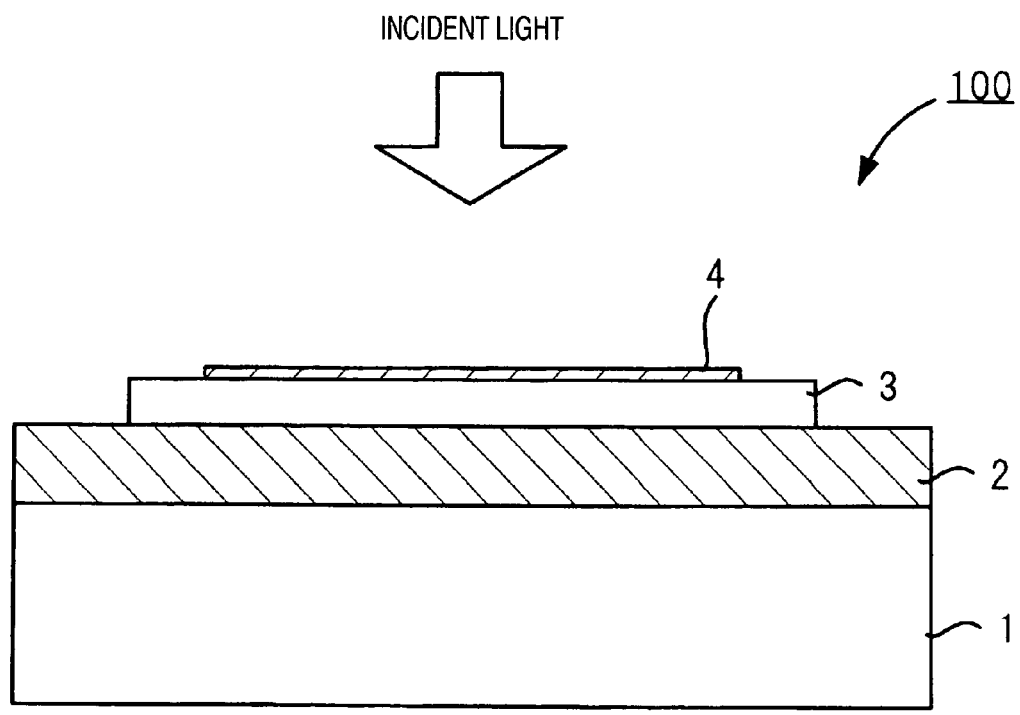
FIG. 1 is a schematic cross-sectional view to show an outline configuration of a photoelectric conversion device for explaining a first embodiment of the invention.

FIG. 1 is a schematic cross-sectional view to show an outline configuration of a photoelectric conversion device for explaining a first embodiment of the invention.

A photoelectric conversion device 100 as illustrated in FIG. 1 is provided with a lower electrode 2 formed on a substrate 1, an upper electrode 4 opposing to the lower electrode 2 and an interlayer 4 between the lower electrode 2 and the upper electrode 4, with the interlayer including at least a photoelectric conversion layer 3.

In the embodiment of FIG. 1, the photoelectric conversion device is configured such that light is made incident from a side of the upper electrode 4, and a charge is generated in the photoelectric conversion layer 3 corresponding to this light; and that by applying a bias voltage of, for example, 0.1 V or more and not more than 30 V to the lower electrode 2 and the upper electrode 4, the charge generated in the photoelectric conversion layer 3 transfers into the lower electrode 2 and the upper electrode 4, and a signal corresponding to the charge which has transferred into either one of the lower electrode 2 or the upper electrode 4 can be extracted outside.

The lower electrode 2 is an electrode for collecting the charge (for example, an electron or a hole) generated in the photoelectric conversion layer 3. For the lower electrode 2, a metallic electrode having a reflection function to reflect light is used. Examples of such a metallic electrode include Ag, Al, Ca, In, Mg, Mn, Ta, Ti, V, W, Au, Co, Fe, Mo, Pd, Pt, and mixtures thereof. The material of the lower electrode 2 may be properly selected corresponding to a wavelength of the light to be absorbed in the photoelectric conversion layer 3. For example, in the case where the photoelectric conversion layer 3 absorbs visible light in the range of from about 420 nm to about 660 nm, the lower electrode 2 may be formed of a metallic electrode having a function to reflect visible light; and in the case where the photoelectric conversion layer 3 absorbs light in an infrared region, the lower electrode 2 may be formed of a metallic electrode having a function to reflect light in an infrared region. Incidentally, since the photoelectric conversion layer 3 is formed on the lower electrode 2, when the surface of the lower electrode 2 is irregular, the photoelectric conversion layer 3 has a shape reflecting these irregularities, leading to deterioration of the performance of the device. For that reason, it is preferable that the surface of the lower electrode 2 has a mean surface roughness Ra of not more than 3 nm.

The upper electrode 4 is an electrode for collecting the charge (for example, an electron or a hole) generated in the photoelectric conversion layer 3. Since it is needed to make light incident into the photoelectric conversion layer 3, it is preferable that the upper electrode 4 is transparent. It is meant by the term "transparent" as referred to in this specification that the electrode transmits 80% or more of visible light or infrared light. A transparent conducting oxide is suitable as the transparent electrode material, and ITO (Sn-doped indium oxide) or the like is enumerated as a candidate from the viewpoints of processing suitability and smoothness. Furthermore, the upper electrode 4 may be brought with a function to transmit light by using a metallic thin layer having a metal vapor deposited thereon. Though a thickness of the upper electrode 4 varies depending upon a necessary light transmittance as the material, it is preferably in the range of from 5 nm to 200 nm.

The photoelectric conversion layer 3 is constituted of a photoelectric conversion material for absorbing light having a specified wavelength and generating a charge corresponding to the absorbed light. The photoelectric conversion layer 3 may be of a single-layered structure or a multilayered structure. As the photoelectric conversion material constituting the photoelectric conversion layer 3, though an inorganic material and an organic material can be used, it is especially preferred to use an organic material because it is excellent in spectral characteristics and sensitivity. A highly crystalline organic material is more preferable because of its high photoelectric conversion performance. Examples of the organic material constituting the photoelectric conversion layer 3 include a material having a quinacridone skeleton, a material having a phthalocyanine skeleton and a material having an anthraquinone skeleton. In the case of using quinacridone represented by the following chemical formula (1) as the photoelectric conversion layer 3, it is possible to absorb light in a green wavelength region in the photoelectric conversion layer 3 and to generate a charge corresponding thereto. In the case of using zinc phthalocyanine represented by the following chemical formula (2) as the photoelectric conversion layer 3, it is possible to absorb light in a red wavelength region in the photoelectric conversion layer 3 and to generate a charge corresponding thereto. In the case of using anthraquinone A represented by the following chemical formula (3) as the photoelectric conversion layer 3, it is possible to absorb light in a blue wavelength region in the photoelectric conversion layer 3 and to generate a charge corresponding thereto.

Chemical Formula (1)

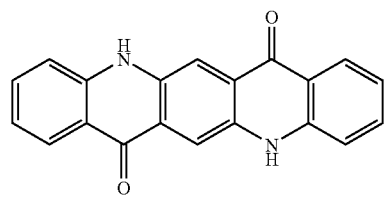

-continued

Chemical Formula (2)

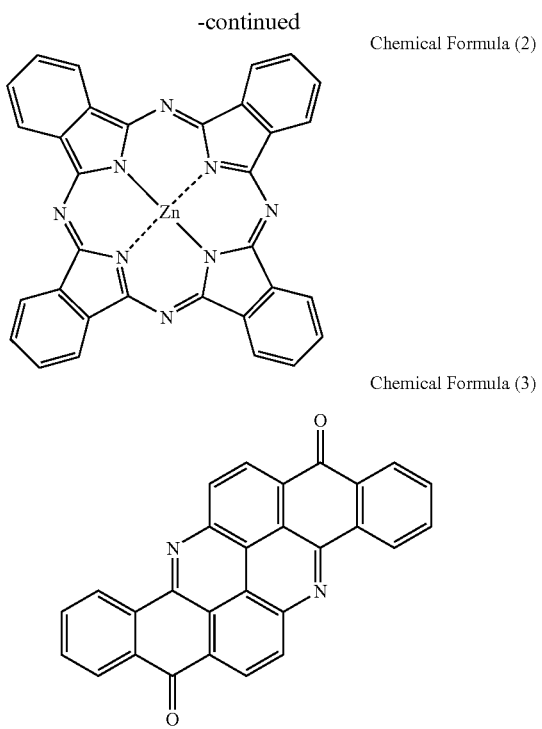

Chemical Formula (3)

Incidentally, the interlayer may include, in addition to the photoelectric conversion layer 3, a charge blocking layer for inhibiting the injection of a charge from the lower electrode 2 and the upper electrode 4 into the photoelectric conversion layer 3 at the application of a bias voltage to the lower electrode 2 and the upper electrode 4.

Simply thinking, when light is made incident into the photoelectric conversion device 100, light in a specified wavelength region which has transmitted through the upper electrode 4 is absorbed in the photoelectric conversion layer 3; the light which has transmitted through the photoelectric conversion layer 3 is reflected by the lower electrode 2 and again made incident into the photoelectric conversion layer 3; and the light which has not been completely absorbed some time ago in the photoelectric conversion layer 3 is further absorbed. Then, when a bias voltage is applied between the lower electrode 2 and the upper electrode 4, the charge generated in the photoelectric conversion layer 3 is collected by the lower electrode 2 and the upper electrode 4, and a photocurrent is extracted outside. In this way, the absorption factor can be increased due to the effect of light reflection in the lower electrode 2.

With respect to the effect of light reflection, other effects than an increase in absorption factor due to simple reciprocation of light can be enumerated. When a photoelectric field is interfered with each other between incident light and reflected light, the absorption factor complicatedly varies depending upon a thickness of the interlayer, a wavelength of the incident light, or the like.

As described above, by reflecting light at the lower electrode 2, since the absorption factor of the photoelectric conversion layer 3 increases, it is possible to gain the absorption factor even without thickening the thickness of the photoelectric conversion layer 3. As will be clear from the comparison in simulations as described later, by properly designing the layer thickness and the material, even when the photoelectric conversion layer has a thickness of not more than 100 nm, it is possible to absorb 80% or more of light in an absorption peak wavelength in a visible region.

In addition, since the absorption factor varies depending upon the thickness of the interlayer, the wavelength of the incident light, or the like due to the interference effect, a half value width of an optical absorption spectrum in the photoelectric conversion layer 3 also varies. By utilizing this and designing a material having a proper optical constant and a thickness thereof, it is possible to sharpen an absorption spectrum in the photoelectric conversion layer 3 and to sharpen an action spectrum of the photoelectric conversion device. As demonstrated in Examples 1 and 2 as described later, it is possible to control the half value width at not more than 130 nm.

In the case where the photoelectric conversion layer 3 is made thin, the following problems are caused.

Since the transparent conducting oxide used in the upper electrode 4 is in general formed by a sputtering method, in forming the upper electrode 4 on the photoelectric conversion layer 3, sputtered grains enter into irregularities of the surface of the photoelectric conversion layer 3 which has already been formed at the formation of the upper electrode 4, whereby the device is easy to cause a short circuit. In the case where the photoelectric conversion layer 3 is thin, this problem becomes remarkable. In particular, in the case of using, as the photoelectric conversion layer 3, a polycrystalline layer made of a pigment based material having a lot of irregularities or the like, this phenomenon becomes remarkable. The "polycrystalline layer" as referred to herein is a layer in which fine crystals having a different crystal orientation from each other in the same material are gathered and a relatively large number of irregularities are present on the surface thereof as compared with a single crystalline material or an amorphous material.

Furthermore, while not directly related with thinning of the photoelectric conversion layer 3, since the upper electrode 4 is formed by a sputtering method, the photoelectric conversion layer 3 is easily damaged due to plasma at the sputtering, thereby deteriorating the device characteristics. In addition, sputtered grains enter into irregularities of the surface of the photoelectric conversion layer 3, whereby irregularities are also formed on a surface of the upper electrode 4. When the irregularities are present on the surface of the upper electrode 4, a uniform electric field cannot be applied within the photoelectric conversion layer 3 at the application of a bias to the photoelectric conversion layer 3, and a region where a high electric field is locally generated is formed, resulting in causing an increase of a leak current.

Figure 2:
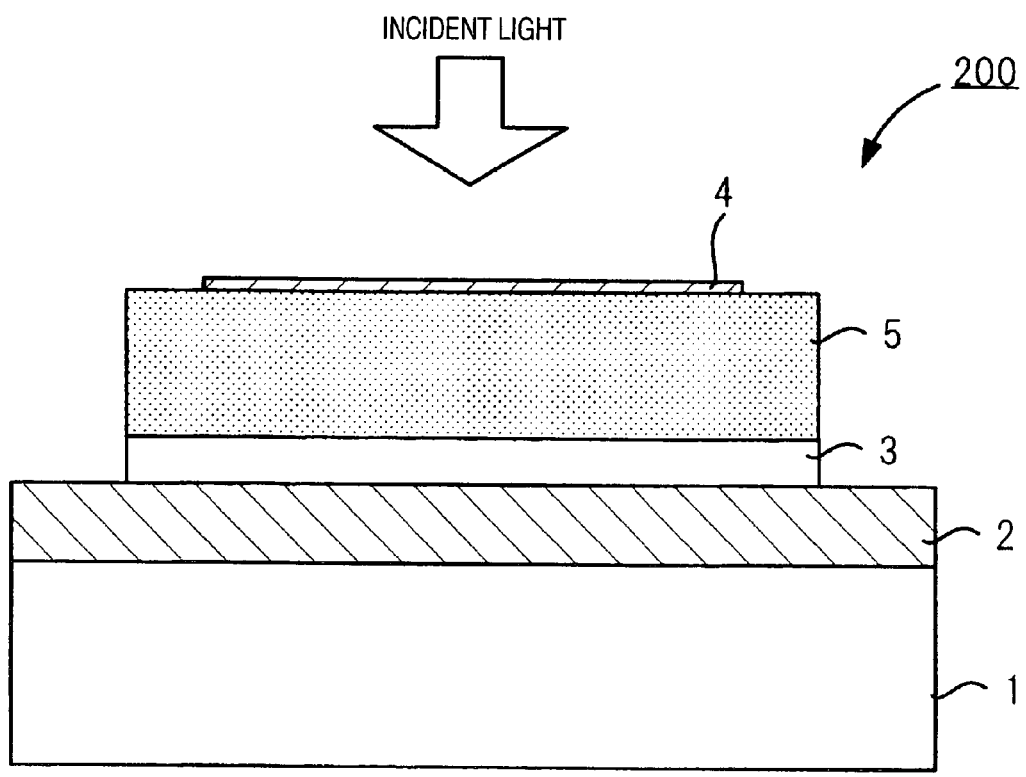
FIG. 2 is a schematic cross-sectional view to show an outline configuration of a modification of a photoelectric conversion device for explaining a first embodiment of the invention.

Then, a configuration for solving such a problem is illustrated in FIG. 2.

FIG. 2 is a schematic cross-sectional view to show an outline configuration of a modification of a photoelectric conversion device for explaining the first embodiment of the invention. In FIG. 2, configurations the same as in FIG. 1 are given the same symbols.

A photoelectric conversion device 200 as illustrated in FIG. 2 is configured such that a smoothing layer 5 for reducing roughness of the surface of the photoelectric conversion layer 3 is supplemented between the photoelectric conversion layer 3 and the upper electrode 4 of the photoelectric conversion device 100 as illustrated in FIG. 1. It is preferable that a mean surface roughness Ra of a surface of the smoothing layer 5 is not more than 1 nm. Incidentally, an effect to be brought by introducing the smoothing layer 5 is described in detail in Japanese Patent Application No. 2006-45955.

As the smoothing layer 5, any organic material or inorganic material can be used so far as it has a small roughness of a surface thereof and does not cause a short circuit of the photoelectric conversion layer 3. In particular, an amorphous material is preferably used because it does not have large roughness of its surface. Since light must be made incident into the photoelectric conversion layer 3, it is preferable that the smoothing layer 5 is transparent. A thickness of the smoothing layer 5 is preferably in the range of from 10 to 300 nm. For reducing roughness effectively, the thickness of the smoothing layer 5 is especially preferably 30 nm or more. Furthermore, when the thickness of the smoothing layer 5 is too thick, a bias voltage to be applied to the photoelectric conversion layer 3 becomes large. Therefore, the thickness of the smoothing layer 5 is preferably not more than 200 nm. Furthermore, for the purpose of effectively preventing a short circuit from occurring, it is preferable that a mean surface roughness Ra of the surface of the smoothing layer 5 is not more than 1 nm.

In the photoelectric conversion device 200 as illustrated in FIG. 2, in the case where the upper electrode 4 works as an electrode for collecting holes, namely in the case where a bias voltage is applied so as to transfer a hole generated in the photoelectric conversion layer 3 into the upper electrode 4 and to transfer an electron generated in the photoelectric conversion layer 3 into the lower electrode 2, it is preferable that a material constituting the smoothing layer 5 is a hole transporting material. Examples of the hole transporting material which is suitable for the smoothing layer 5 include triphenylamine based organic materials having a triphenylamine structure. In addition, examples of the triphenylamine based organic material include starburst amine based organic materials having a starburst amine structure in which triphenylamine structures are connected to each other in a star-like state. The "starburst amine structure" as referred to herein means a structure of TDATA represented by the following chemical formula (4). As the triphenylamine based organic material, a material represented by the following chemical formula (5) (hereinafter referred to as "Amine A") and so on can be used. In addition, as the starburst amine based organic material, m-MTDATA (4,4',4''-tris(3-methylphenylphenylamino)triphenylamine) represented by the following chemical formula (6) and so on can be used.

Chemical Formula (4)

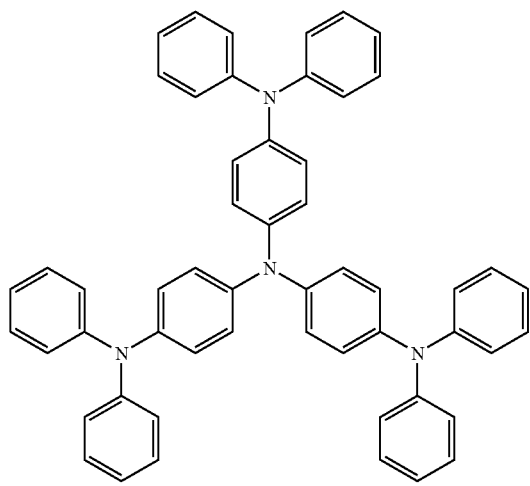

Chemical Formula (5)

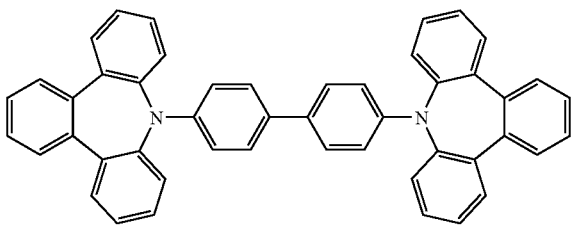

Chemical Formula (6)

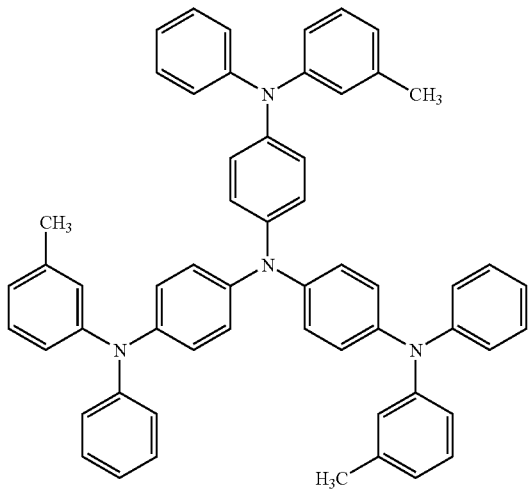

Furthermore, in the photoelectric conversion device 200, in the case where the upper electrode 4 works an electrode for collecting electrons, namely in the case where a bias voltage is applied so as to transfer an electron generated in the photoelectric conversion layer 3 into the upper electrode 4 and to transfer a hole generated in the photoelectric conversion 3 into the lower electrode 2, a material constituting the smoothing layer 5 is preferably an electron transporting material. $Alq_3$ (tris(8-hydroxyquinolinato)aluminum(III)) represented by the following chemical formula (7) or a derivative thereof can be used as the electron transporting material which is suitable for the smoothing layer 5.

Chemical Formula (7)

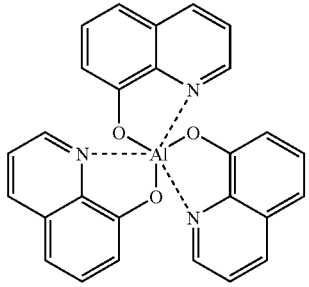

When this smoothing layer 5 is present, even in the case of forming the upper electrode 4 by a sputtering method, it is possible to prevent sputtered grains from entering into the irregularities of the surface of the photoelectric conversion layer 3. Also, it is possible to prevent the photoelectric conversion layer 3 from being exposed to plasma by the smoothing layer 5. Also, since the upper electrode 4 is formed on the smooth surface 5, the upper electrode 4 can be made flat, and a uniform electric field can be applied within the photoelectric conversion layer 3. In this way, by providing the smoothing layer 5, it is possible to prevent the photoelectric conversion device 200 from the deterioration in performance at the deposition of an electrode. Incidentally, in the case where the photoelectric conversion layer 3 is configured to have a polycrystalline layer, the irregularities on the surface of the photoelectric conversion layer 3 are remarkably observed. For that reason, in such a configuration, it is especially effective to provide the smoothing layer 5. Furthermore, the smoothing layer 5 may also be constituted of a photoelectric conversion material by itself. Examples of an organic material constituting the polycrystalline layer include the foregoing quinacridone.

In a photoelectric conversion device of a structure in which a photoelectric conversion layer is sandwiched by two electrodes as illustrated in FIGS. 1 and 2, in particular, in the case where a transparent electrode with high transparency such as ITO is an electrode for collecting electrons, a dark current at the application of a bias becomes considerably large.

As one of causes of the dark current, there may be thought a current flowing from the electrode for collecting electrons into the photoelectric conversion layer at the application of a bias. In the case where an electrode with high transparency such as an ITO transparent electrode is an electrode for collecting electrons, it was thought that since the work function of the subject electrode is relatively large, a barrier during transfer of a hole from the electrode for collecting electrons into the photoelectric conversion layer is low so that the injection of a hole into the photoelectric conversion layer is easy to occur. Actually, in examining work functions of metal oxide based transparent electrodes with high transparency such as ITO, for example, a work function of an ITO electrode is about 4.8 eV, and this value is considerably high as compared with a work function of an Al (aluminum) electrode of about 4.3 eV. Furthermore, it is known that transparent electrodes made of a metal oxide other than ITO have a relatively large work function as from about 4.6 to 5.4, except for AZO (Al-doped zinc oxide) having the smallest work function as about 4.5 eV (see, for example, *J. Vac. Sci. Technol. A*, 17(4), July/August 1999, pages 1765 to 1772, FIG. 12).

In the light of the above, when the work function of the electrode for collecting electrons is large, it may be thought that a barrier during transfer of a hole from the electrode for collecting electrons into the photoelectric conversion layer is low at the application of a bias so that the injection of a hole from the electrode for collecting electrons into the photoelectric conversion layer is easy to occur, resulting in an increase of a dark current.

Then, in the photoelectric conversion devices 100 and 200 as illustrated in FIGS. 1 and 2, it is preferable that the electrode for collecting electrons is adjusted so as to have a work function of not more than 4.5 eV. For example, when the upper electrode 4 works as an electrode for collecting electrons, examples of a method of adjusting the work function of the upper electrode 4 at not more than 4.5 eV are given below. Incidentally, the adjustment of the work function of an electrode is described in detail in Japanese Patent Application No. 2005-251745.

(A) A work function adjusting layer for adjusting the work function of the lower electrode 2 is provided between the upper electrode 4 and the photoelectric conversion layer 3.

For example, ITO is used as the upper electrode 4, and a metallic thin layer containing In, Ag or Mg and having a work function of not more than 4.5 eV is used as the work function adjusting layer.

(B) A conducting transparent metal oxide thin layer having a work function of not more than 4.5 eV is used as the upper electrode 4.

For example, an AZO thin layer having a work function of 4.5 eV is used as the conducting transparent metal oxide thin layer.

(C) A transparent electrode whose work function has been adjusted at not more than 4.5 eV upon doping on a metal oxide is used as the upper electrode 4.

For example, an electrode whose work function has been adjusted at not more than 4.5 eV by doping Cs on ITO as the conducting metal oxide is used.

(D) An electrode whose work function has been adjusted at not more than 4.5 eV by surface treating a conducting transparent metal oxide thin layer is used as the upper electrode 4.

For example, an electrode whose work function has been adjusted at not more than 4.5 eV by using ITO and surface treating this ITO upon immersion in an alkaline solution is used as the upper electrode 4. Alternatively, an electrode whose work function has been adjusted at not more than 4.5 eV by surface treating ITO by sputtering with an Ar ion or an Ne ion.

Incidentally, in the case where the lower electrode 2 works as an electrode for collecting electrons, the lower electrode 2 may be adjusted so as to have a work function of not more than 4.5 eV. Since the lower electrode 2 originally uses a metallic electrode having a small work function, it is possible to simply adjust the work function at not more than 4.5 eV by selecting a material.

In the case where the upper electrode 4 which is an electrode in the light indent side works an electrode for collecting electrons, it is better that the work function of the lower electrode 2 which is an electrode for collecting holes is 4.5 eV or more. In addition, it has been found that by adjusting the work function of the upper electrode 4 at not more than 4.5 eV, not only a dark current can be inhibited, but also a bias voltage can be suppressed on a low level.

With respect to the metal as the material of the lower electrode 2, as shown in the following Table 2, almost all of metals have a work function of not more than 4.5 eV, and examples of a metal having a work function of 4.5 eV or more include Au, Co, Fe, Mo, Pd, Pt, and mixtures thereof. For that reason, by using such a metal for the lower electrode 2, it is possible to adjust the work function of the lower electrode 2 at 4.5 eV or more. However, since such a material is not so large with respect to a function to reflect light, an optical interference effect becomes weak. Furthermore, the material itself is expensive so that the manufacturing costs become high. Then, in the case where it is intended to adjust the work function of the lower electrode 2 at 4.5 eV or more while keeping an optical interference effect and realizing low costs, configurations as illustrated in FIGS. 3 and 4 may be employed.

Figure 3:
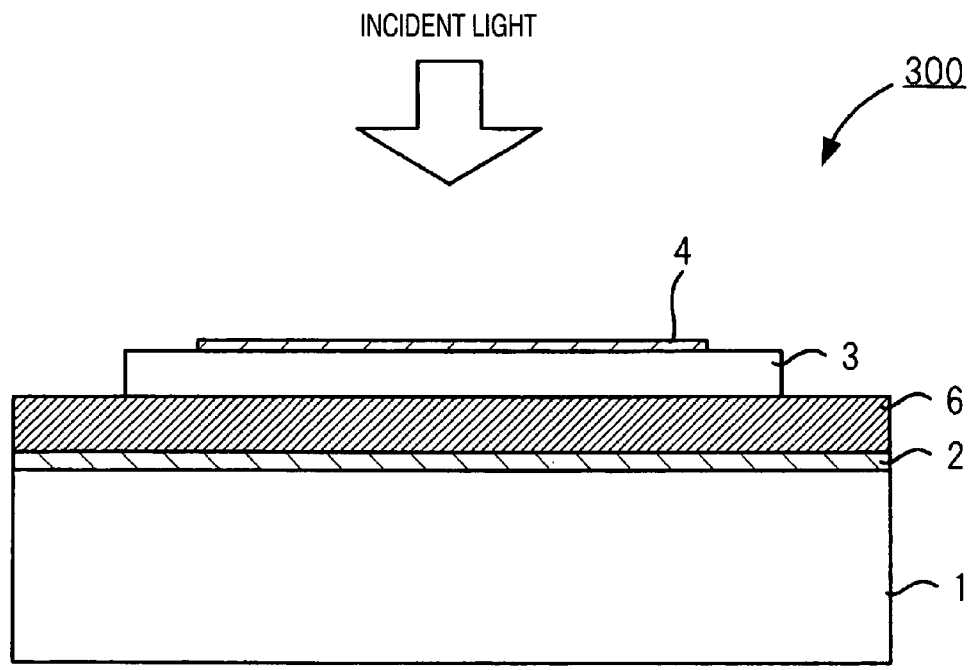
FIG. 3 is a schematic cross-sectional view to show an outline configuration of a modification of a photoelectric conversion device for explaining a first embodiment of the invention.
Figure 4:
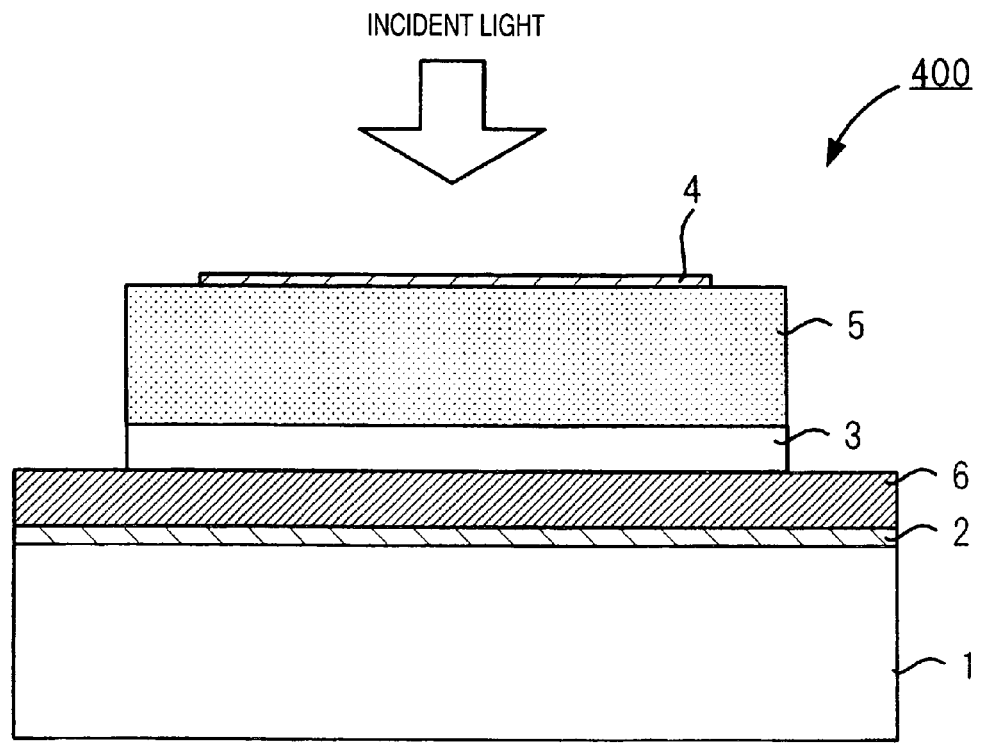
FIG. 4 is a schematic cross-sectional view to show an outline configuration of a modification of a photoelectric conversion device for the purpose of explaining a first embodiment of the invention.

FIG. 3 is a schematic cross-sectional view to show an outline configuration of a modification of a photoelectric conversion device for explaining the first embodiment of the invention. In FIG. 3, configurations the same as in FIG. 1 are given the same symbols. FIG. 4 is a schematic cross-sectional view to show an outline configuration of a modification of a photoelectric conversion device for explaining the first embodiment of the invention. In FIG. 4, configurations the same as in FIG. 2 are given the same symbols.

A photoelectric conversion device 300 as illustrated in FIG. 3 is configured such that a work function adjusting layer 6 for adjusting a work function of the lower electrode 2 is supplemented between the lower electrode 2 and the photoelectric conversion layer 3 of the photoelectric conversion device 100 as illustrated in FIG. 1. A photoelectric conversion device 400 as illustrated in FIG. 4 is configured such that a work function adjusting layer 6 for adjusting a work function of the lower electrode 2 is supplemented between the lower electrode 2 and the photoelectric conversion layer 3 of the photoelectric conversion device 200 as illustrated in FIG. 2. Incidentally, in each of the photoelectric conversion device 300 and the photoelectric conversion device 400, the upper electrode 4 is used as an electrode for collecting electrons.

The work function adjusting layer 6 is to adjust the work function of the lower electrode 2 at 4.5 eV or more, and a transparent electrode having a work function of 4.5 eV or more is used. A transparent conducting oxide is suitable as the transparent electrode material, and ITO (Sn-doped indium oxide) or the like is enumerated as a candidate from the viewpoints of processing suitability and smoothness. In this way, by providing the work function adjusting layer 6, it is possible to relieve the restrictions in selecting the material of the lower electrode 2; and it is possible to inhibit a dark current and to achieve driving at a low bias while keeping an optical interference effect and realizing low costs.

Examples of documents regarding the adjustment of a work function of a transparent electrode made of ITO are given below.

TABLE 1

Examples of documents regarding the adjustment of work function of ITO electrode (non-patent documents)

| Document | Authors | Method | Change in work function | Evaluation method | Factor of change |
|---|---|---|---|---|---|
| Applied Physics Letters, 74, 880 (1999) | F. Nuesch, et al. | After $O_2$ (Ar) plasma treatment, acid or alkali treatment | 5.1 eV at maximum by acid treatment or 3.9 eV at minimum by alkali treatment | Ultraviolet photoelectron spectroscopy | Formation of electric double layer as caused due to $H^+/OH^-$ adsorption on the surface |
| Synthetic Metals, 96, 77 (1998) | T. Osada, et al. | After solvent washing and $H_2O_2$ treatment, $Ne^+$ sputtering | 4.8 eV by $H_2O_2$ treatment and 4.0 eV by $Ne^+$ sputtering | Ultraviolet photoelectron spectroscopy | Reduction of O ratio of the surface by $Ne^+$ sputtering |
| Journal of Applied Physics, 87, 295 (2000) | K. Sugiyama, et al. | UV ozone treatment or $Ar^+$ sputtering | 4.75 eV by UV ozone treatment or 4.3 eV by $Ar^+$ sputtering | Ultraviolet photoelectron spectroscopy | Elimination of C contamination by UV ozone or reduction of O ratio by $Ar^+$ sputtering |
| Applied Surface Science, 218, 258 (2003) | J.A. Chaney, et al. | $O_2$ plasma treatment or alkali treatment | 5.3 eV by $O_2$ plasma treatment or 4.5 eV alkali treatment | Oscillation capacity method (Kelvin method) | Formatation of electric double layer as caused due to $OH^-$ adsorption |
| Japanese Journal of Applied Physics, 44, 5939 (2005) | T. Uchida, et al. | Mixing of Cs vapor in Ar gas for sputtering at the time of ITO film formation | 4.1 eV at minimum by mixing of Cs vapor | Atmospheric photoelectron spectroscopy | Doping of Cs into ITO |

Furthermore, metals having a work function of not more than 4.5 eV are enumerated below along with characteristics thereof.

TABLE 2

Characteristics of metal having a low work function (excluding alkali metals)

| | Work function (eV) | Melting point (° C.) | Boiling point (° C.) | Bulk resistivity (Ωcm) | Reaction with air or water |
|---|---|---|---|---|---|
| Ag | 4.2 | ○: 950 | ○: 2210 | ○: 1.5 × 10$^{-6}$ | ○: Inert |
| Al | 4.3 | ○: 660 | ○: 2470 | ○: 2.5 × 10$^{-6}$ | Δ: Oxide film formed |
| Ba | 2.5 | ○: 730 | ○: 1640 | Δ: 4.6 × 10$^{-5}$ | X: Oxidized and soluble in water |
| Bi | 4.2 | ○: 270 | ○: 1610 | X: 1.1 × 10$^{-4}$ | ○: Inert |
| Ca | 2.9 | ○: 840 | ○: 1480 | ○: 3.2 × 10$^{-6}$ | X: Oxidized and soluble in water |
| Eu | 2.5 | ○: 820 | ○: 1600 | Δ: 9.0 × 10$^{-5}$ | X: Oxidized and soluble in water |
| Ga | 2.6 | X: 28 | ○: 2400 | Δ: 1.4 × 10$^{-5}$ | ○: Inert |
| Hf | 3.9 | ○: 2230 | Δ: 5200 | Δ: 3.5 × 10$^{-5}$ | Δ: Oxide film formed |
| In | 4.1 | ○: 160 | ○: 2080 | ○: 8.0 × 10$^{-6}$ | ○: Inert |
| La | 3.5 | ○: 920 | ○: 3460 | ○: 5.7 × 10$^{-6}$ | X: Oxidized and soluble in water |
| Lu | 3.3 | ○: 1660 | ○: 3400 | Δ: 7.9 × 10$^{-5}$ | X: Oxidized and soluble in water |
| Mg | 3.7 | ○: 650 | ○: 1090 | ○: 3.9 × 10$^{-6}$ | X: Oxidized |
| Mn | 4.1 | ○: 1240 | ○: 1960 | X: 2.6 × 10$^{-4}$ | X: Oxidized and soluble in water |
| Nb | 4.3 | ○: 2470 | Δ: 4740 | Δ: 1.3 × 10$^{-5}$ | Δ: Oxide film formed |
| Nd | 3.2 | ○: 1020 | ○: 3070 | Δ: 6.4 × 10$^{-5}$ | X: Soluble in water |
| Pb | 4.2 | ○: 330 | ○: 1740 | Δ: 1.9 × 10$^{-5}$ | X: Oxidized |
| Sc | 3.5 | ○: 1540 | ○: 2830 | Δ: 6.1 × 10$^{-5}$ | X: Oxidized and soluble in water |
| Sm | 2.7 | ○: 1080 | ○: 1790 | Δ: 8.8 × 10$^{-5}$ | X: Soluble in water |
| Sn | 4.5 | ○: 230 | ○: 2270 | Δ: 9.4 × 10$^{-5}$ | ○: Inert |
| Ta | 4.3 | ○: 3000 | Δ: 5430 | Δ: 1.2 × 10$^{-5}$ | ○: Inert |
| Tb | 3.0 | ○: 1360 | ○: 3120 | | X: Oxidized and soluble in water |
| Th | 3.4 | ○: 1750 | Δ: 4790 | Δ: 1.3 × 10$^{-5}$ | X: Ignited |
| Ti | 4.3 | ○: 1660 | ○: 3290 | Δ: 5.8 × 10$^{-5}$ | ○: Inert |
| V | 4.3 | ○: 1890 | ○: 3377 | Δ: 2.5 × 10$^{-5}$ | ○: Inert |
| W | 4.4 | ○: 3410 | Δ: 5660 | ○: 4.9 × 10$^{-6}$ | ○: Inert |
| Y | 3.1 | ○: 1520 | Δ: 3340 | Δ: 5.7 × 10$^{-5}$ | X: Oxidized |
| Zn | 4.3 | ○: 420 | Δ: 910 | ○: 5.5 × 10$^{-6}$ | X: Oxidized |
| Zr | 4.1 | ○: 1850 | Δ: 4380 | Δ: 4.0 × 10$^{-5}$ | Δ: Oxide film formed |

Specific examples of the interlayer including the foregoing photoelectric conversion layer 3 are hereunder described.

(Interlayer)

The interlayer is formed by a stack or a mixture of a photoelectric-conversion layer, an electron transport site, a hole transport side, an electron blocking side, a hole blocking side, a crystallization preventing site, and so on. Alternatively, the interlayer may be configured of a photoelectric conversion layer alone. It is preferable that the photoelectric conversion layer contains an organic p-type compound or an organic n-type compound.

The organic p-type semiconductor (compound) is an organic semiconductor (compound) having donor properties and refers to an organic compound which is mainly represented by a hole transporting organic compound and which has properties such that it is liable to donate an electron. In more detail, the organic p-type semiconductor refers to an organic compound having a smaller ionization potential in two organic compounds when they are brought into contact with each other and used. Accordingly, with respect to the organic compound having donor properties, any organic compound can be used so far as it is an electron donating organic compound. Useful examples thereof include triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, fused aromatic carbocyclic compounds (for example, naphthalene derivatives, anthracene derivatives, phenanthrene derivatives, tetracene derivatives, pyrene derivatives, perylene derivatives, and fluoranthene derivatives), and metal complexes having, as a ligand, a nitrogen-containing heterocyclic compound. Incidentally, the invention is not limited to these compounds, and as described previously, an organic compound having a smaller ionization potential than that of an organic compound to be used as an n-type compound (having acceptor properties) may be used as the organic semiconductor having donor properties.

The organic n-type semiconductor (compound) is an organic semiconductor (compound) having acceptor properties and refers to an organic compound which is mainly represented by an electron transporting organic compound and which has properties such that it is liable to accept an electron. In more detail, the organic n-type semiconductor refers to an organic compound having a larger electron affinity in two organic compounds when they are brought into contact with each other and used. Accordingly, with respect to the organic compound having acceptor properties, any organic compound can be used so far as it is an electron accepting organic compound. Useful examples thereof include fused aromatic carbocyclic compounds (for example, naphthalene derivatives, anthracene derivatives, phenanthroline derivatives, tetracene deriveatives, pyrene derivatives, perylene derivatives, and fluoranthene derivatives), 5- to 7-membered heterocyclic compounds containing a nitrogen atom, an oxygen atom or a sulfur atom (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepine, and tribenzazepine), polyarylene compounds, fluorene compounds, cyclopentadiene compounds, silyl compounds, and metal complexes having, as a ligand, a nitrogen-containing heterocyclic compound. Incidentally, the invention is not limited to these compounds, and as described previously, an organic compound having a larger electron affinity than that of an organic compound to be used as an organic compound having donor properties may be used as the organic semiconductor having acceptor properties.

Though any organic dye is useful as the p-type organic dye or n-type organic dye, preferred examples thereof include cyanine dyes, styryl dyes, hemicyanine dyes, merocyanine dyes (inclusive of zeromethinemerocyanine (simple merocyanine)), trinuclear merocyanine dyes, tetranuclear merocyanine dyes, rhodacyanine dyes, complex cyanine dyes, complex merocyanine dyes, alopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethine dyes, spiro compounds, metallocene dyes, fluorenone dyes, flugide dyes, perylene dyes, phenazine dyes, phenothiazine dyes, quinone dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, porphyrin dyes, chlorophyll dyes, phthalocyanine dyes, metal complex dyes, and fused aromatic carbocyclic compounds (for example, naphthalene derivatives, anthracene derivatives, phenanthrene derivatives, tetracene derivatives, pyrene derivatives, perylene derivatives, and fluoranthene derivatives).

Next, the metal complex compound will be described. The metal complex compound is a metal complex having a ligand containing at least one of a nitrogen atom, an oxygen atom and a sulfur atom coordinated to a metal. Though a metal ion in the metal complex is not particularly limited, it is preferably a beryllium ion, a magnesium ion, an aluminum ion, a gallium ion, a zinc ion, an indium ion, or a tin ion; more preferably a beryllium ion, an aluminum ion, a gallium ion, or a zinc ion; and further preferably an aluminum ion or a zinc ion. As the ligand which is contained in the metal complex, there are enumerated various known ligands. Examples thereof include ligands as described in H. Yersin, *Photochemistry and Photophysics of Coordination Compounds*, Springer-Verlag, 1987; and Akio Yamamoto, *Organometallic Chemistry—Principles and Applications*, Shokabo Publishing Co., Ltd., 1982.

The foregoing ligand is preferably a nitrogen-containing heterocyclic ligand (having preferably from 1 to 30 carbon atoms, more preferably from 2 to 20 carbon atoms, and especially preferably from 3 to 15 carbon atoms, which may be a monodentate ligand or a bidentate or polydentate ligand, with a bidentate ligand being preferable; and examples of which include a pyridine ligand, a bipyridyl ligand, a quinolinol ligand, and a hydroxyphenylazole ligand (for example, a hydroxyphenylbenzimidazole ligand, a hydroxyphenylbenzoxazole ligand, and a hydroxyphenylimidazole ligand), an alkoxy ligand (having preferably from 1 to 30 carbon atoms, more preferably from 1 to 20 carbon atoms, and especially preferably from 1 to 10 carbon atoms, examples of which include methoxy, ethoxy, butoxy, and 2-ethylhexyloxy), an aryloxy ligand (having preferably from 6 to 30 carbon atoms, more preferably from 6 to 20 carbon atoms, and especially preferably from 6 to 12 carbon atoms, examples of which include phenyloxy, 1-naphthyloxy, 2-naphthyloxy, 2,4,6-trimethylphenyloxy, and 4-biphenyloxy), a heteroaryloxy ligand (having preferably from 1 to 30 carbon atoms, more preferably from 1 to 20 carbon atoms, and especially preferably from 1 to 12 carbon atoms, examples of which include pyridyloxy, pyrazyloxy, pyrimidyloxy, and quinolyloxy), an alkylthio ligand (having preferably from 1 to 30 carbon atoms, more preferably from 1 to 20 carbon atoms, and especially preferably from 1 to 12 carbon atoms, examples of which include methylthio and ethylthio), an arylthio ligand (having preferably from 6 to 30 carbon atoms, more preferably from 6 to 20 carbon atoms, and especially preferably from 6 to 12 carbon atoms, examples of which include phenylthio), a heterocyclic substituted thio ligand (having preferably from 1 to 30 carbon atoms, more preferably from 1 to 20 carbon atoms, and especially preferably from 1 to 12 carbon atoms, examples of which include pyridylthio, 2-benzimidazolylthio, 2-benzoxazolylthio, and 2-benzothiazolylthio), or a siloxy ligand (having preferably from 1 to 30 carbon atoms, more preferably from 3 to 25 carbon atoms, and especially preferably from 6 to 20 carbon atoms, examples of which include a triphenyloxy group, a triethoxysiloxy group, and a triisopropylsiloxy group); more preferably a nitrogen-containing heterocyclic ligand, an aryloxy ligand, a heteroaryloxy ligand, or a siloxy ligand; and further preferably a nitrogen-containing heterocyclic ligand, an aryloxy ligand, or a siloxy ligand.

The case where the photoelectric conversion layer has a p-type semiconductor layer and an n-type semiconductor layer between the lower electrode and the upper electrode, with at least one of the p-type semiconductor and the n-type semiconductor being an organic semiconductor, and a bulk heterojunction structure layer containing the p-type semiconductor and the n-type semiconductor as an interlayer between these semiconductor layers is preferable. By containing a bulk heterojunction structure, it is possible to compensate a drawback that the organic layer has a short carrier diffusion length and to improve the photoelectric conversion efficiency. Incidentally, the bulk heterojunction structure is described in detail in Japanese Patent Application No. 2004-080639.

Furthermore, the case where the photoelectric conversion layer has a structure having two or more of a repeating structure (tandem structure) of a pn junction layer formed of the p-type semiconductor layer and the n-type semiconductor layer between the lower electrode and the upper electrode is preferable; and the case where a thin layer made of a conducting material is inserted between the foregoing repeating structures is more preferable. The number of the repeating structure (tandem structure) of a pn junction layer is not limited. For the purpose of enhancing the photoelectric conversion efficiency, the number of the repeating structure of a pn junction layer is preferably from 2 to 50, more preferably from 2 to 30, and especially preferably from 2 to 10. The conducting material is preferably silver or gold, and most preferably silver. Incidentally, the tandem structure is described in detail in Japanese Patent Application No. 2004-079930.

In the photoelectric conversion layer having a layer of a p-type semiconductor and a layer of an n-type semiconductor (preferably a mixed or dispersed (bulk heterojunction structure) layer) between the lower electrode and the upper electrode, the case where an orientation-controlled organic compound is contained in at least one of the p-type semiconductor and the n-type semiconductor is preferable; and the case where an orientation-controlled (or orientation controllable) organic compound is contained in both the p-type semiconductor and the n-type semiconductor is more preferable. As this organic compound, an organic compound having a π-conjugated electron is preferably used. It is preferable that this π-electron plane is not vertical to a substrate (electrode substrate) but is oriented at an angle close to parallel to the substrate as far as possible. The angle against the substrate is preferably 0° or more and not more than 80°, more preferably 0° or more and not more than 60°, further preferably 0° or more and not more than 40°, still further preferably 0° or more and not more than 20°, especially preferably 0° or more and not more than 10°, and most preferably 0° (namely, in parallel to the substrate). As described previously, it is merely required that the layer of the orientation-controlled organic compound is contained in even a part of the organic layer against the whole thereof. A proportion of the orientation-controlled portion to the whole of the organic layer is preferably 10% or more, more preferably 30% or more, further preferably 50% or more, still further preferably 70% or more, especially preferably 90% or more, and most preferably 100%. In the photoelectric conversion layer, by controlling the orientation of the organic compound which is contained in the organic layer, the foregoing state compensates a drawback that the organic layer has a short carrier diffusion length, thereby improving the photoelectric conversion efficiency.

In the case where the orientation of an organic compound is controlled, it is more preferable that the heterojunction plane (for example, a pn junction plane) is not in parallel to a substrate. It is preferable that the heterojunction plane is not in parallel to the substrate (electrode substrate) but is oriented at an angle close to verticality to the substrate as far as possible. The angle to the substrate is preferably 10° or more and not more than 90°, more preferably 30° or more and not more than 90°, further preferably 50° or more and not more than 90°, still further preferably 70° or more and not more than 90°, especially preferably 80° or more and not more than 90°, and most preferably 90° (namely, vertical to the substrate). As described previously, it is merely required that the heterojunction plane-controlled organic compound is contained in even a part of the organic layer against the whole thereof. A proportion of the orientation-controlled portion to the whole of the organic layer is preferably 10% or more, more preferably 30% or more, further preferably 50% or more, still further preferably 70% or more, especially preferably 90% or more, and most preferably 100%. In such case, the area of the heterojunction plane in the organic layer increases and the amount of a carrier such as an electron, a hole and a pair of an electron and a hole as formed on the interface increases so that it is possible to improve the photoelectric conversion efficiency. In the light of the above, in the photoelectric conversion element in which the orientation of the organic compound on both the heterojunction plane and the π-electron plane is controlled, it is possible to improve especially the photoelectric conversion efficiency. These states are described in detail in Japanese Patent Application No. 2004-079931. From the standpoint of optical absorption, it is preferable that the thickness of the organic dye layer is thick as far as possible. However, taking into consideration a proportion which does not contribute to the charge separation, the thickness of the organic dye layer is preferably 30 nm or more and not more than 300 nm, more preferably 50 nm or more and not more than 250 nm, and especially preferably 80 nm or more and not more than 200 nm.

(Formation Method of Organic Layer)

The layer containing such an organic compound is fabricated by a dry process or a wet fabrication method. Specific examples of the dry fabrication method include physical vapor deposition methods such as a vacuum vapor deposition method, a sputtering method, an ion plating method, and a molecular beam epitaxy method; and chemical vapor deposition methods such as plasma polymerization. Examples of the wet fabrication method include a coating method, a spin coating method, a dipping method, and an LB method.

In the case of using a high molecular weight compound in at least one of the p-type semiconductor (compound) and the n-type semiconductor (compound), it is preferable that the fabrication is achieved by a wet fabrication method which is easy for the preparation. In the case of employing a dry fabrication method such as vapor deposition, the use of a high molecular weight compound is difficult because of possible occurrence of decomposition. Accordingly, its oligomer can be preferably used as a replacement thereof. On the other hand, in the case of using a low molecular weight compound, a dry fabrication method is preferably employed, and a vacuum vapor deposition method is especially preferably employed. In the vacuum vapor deposition method, a method for heating a compound such as a resistance heating vapor deposition method and an electron beam heating vapor deposition method, the shape of a vapor deposition source such as a crucible and a boat, a degree of vacuum, a vapor deposition temperature, a substrate temperature, a vapor deposition rate, and the like are a basic parameter. In order to make it possible to achieve uniform vapor deposition, it is preferable that the vapor deposition is carried out while rotating the substrate. A high degree of vacuum is preferable. The vacuum vapor deposition is carried out at a degree of vacuum of not more than $10^{-2}$ Pa, preferably not more than $10^{-4}$ Pa, and especially preferably not more than $10^{-6}$ Pa. It is preferable that all steps at the vapor deposition are carried out in vacuo. Basically, the vacuum vapor fabrication is carried out in such a manner that the compound does not come into direct contact with the external oxygen and moisture. The foregoing conditions of the vacuum vapor deposition must be strictly controlled because they affect crystallinity, amorphous properties, density, compactness, and so on. It is preferably employed to subject the vapor deposition rate to PI or PID control using a layer thickness monitor such as a quartz oscillator and an interferometer. In the case of vapor depositing two or more kinds of compounds at the same time, a dual-source vapor deposition method, a flash vapor deposition method and so on can be preferably employed.

(Electrode)

It is preferable that the transparent electrode is prepared in a plasma-free state. By preparing the transparent electrode in a plasma-free state, it is possible to minimize influences of the plasma against the substrate and to make photoelectric conversion characteristics satisfactory. Here, the term "plasma-free state" means a state that plasma is not generated during the fabrication of the transparent electrode or that a distance from the plasma generation source to the substrate is 2 cm or more, preferably 10 cm or more, and more preferably 20 cm or more and that the plasma which reaches the substrate is reduced.

Examples of a device in which plasma is not generated during the fabrication of the transparent electrode include an electron beam heating vapor deposition device (EB vapor deposition device) and a pulse laser vapor deposition device. With respect to the EB vapor deposition device or pulse laser vapor deposition device, devices as described in *Developments of Transparent Conducting Films*, supervised by Yutaka Sawada (published by CMC Publishing Co., Ltd., 1999); *Developments of Transparent Conducting Films II*, supervised by Yutaka Sawada (published by CMC Publishing Co., Ltd., 2002); *Technologies of Transparent Conducting Films*, written by Japan Society for the Promotion of Science (published by Ohmsha, Ltd., 1999); and references as added therein can be used. In the following, the method for achieving deposition of a transparent electrode layer using an EB vapor fabrication device is referred to as "EB vapor deposition method"; and the method for achieving fabrication of a transparent electrode layer using a pulse laser vapor deposition device is referred to as "pulse laser vapor deposition method". With respect to the device capable of realizing the state that a distance from the plasma generation source to the substrate is 2 cm or more and that the plasma which reaches the substrate is reduced (hereinafter referred to as "plasma-free deposition device"), for example, a counter target type sputtering device and an arc plasma vapor deposition method can be thought. With respect to these matters, devices as described in *Developments of Transparent Conducting Films*, supervised by Yutaka Sawada (published by CMC Publishing Co., Ltd., 1999); *Developments of Transparent Conducting Films II*, supervised by Yutaka Sawada (published by CMC Publishing Co., Ltd., 2002); *Technologies of Transparent Conducting Films*, written by Japan Society for the Promotion of Science (published by Ohmsha, Ltd., 1999); and references as added therein can be used.

(Method for Simulation)

Next, the effects which are brought by bringing the lower electrode 2 with a function to reflect light are described with reference to simulation results.

In this simulation, quinacridone (hereinafter abbreviated as "QA") which is a pigment based organic material was used as the material of the photoelectric conversion layer 3. A simulation calculation of an absorption factor based on the calculation of optical interference was performed according to a method of the following Document 1 or 2. Here, with respect to QA, m-MTDATA and Alq$_3$ which are each a material to be used in this simulation, $\Psi$ and $\Delta$ spectra were measured by using a V-VASE rotating-analyzer ellipsometer, manufactured by J.A. Woollam Co., Inc., thereby determining optical constants (refractive index n and extinction coefficient k). These various materials were vapor deposited on a quartz substrate under the same condition as in the preparation of a photoelectric conversion device; reflected light was measured at an incident angle of 50°, 60° and 70°, respectively against light in a wavelength region of from 350 nm to 1,100 nm; and transmitted light was measured at an incident angle of 0°. With respect to ITO, Al, Ag and Au as other materials to be used in this simulation, values described in literature references were interpolated and calculated.

Document 1: L. A. A. Pettersson, et al., *Journal of Applied Physics*, 86, 487 (1999)

Document 2: P. Peumans, et al., *Journal of Applied Physics*, 93, 3693 (2002)

(Comparative Simulation)

Figure 5A:
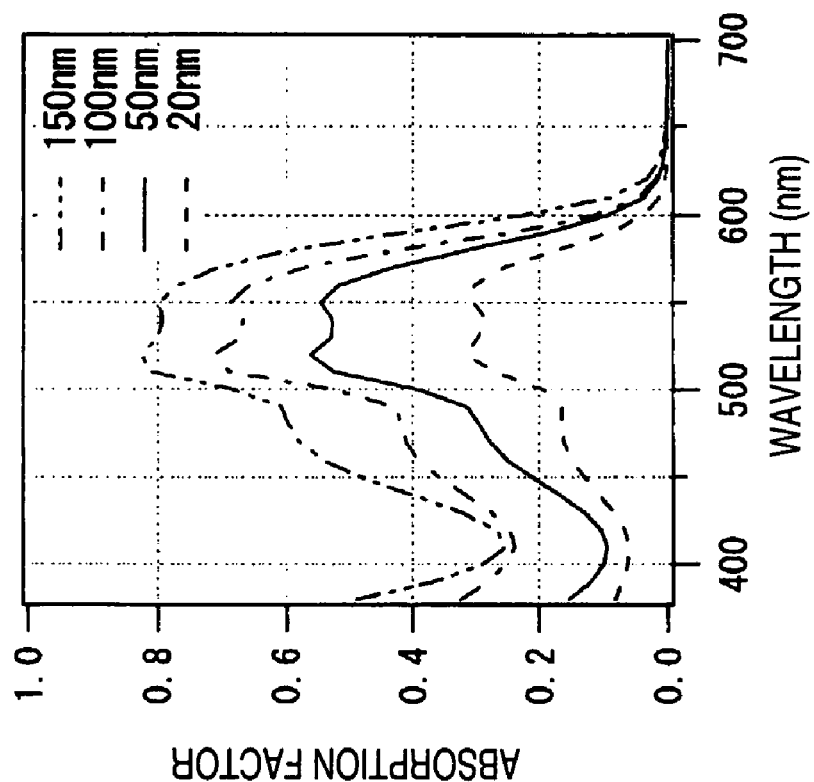
FIGS. 5A and 5B are each a graph to show results of Comparative Simulation.
Figure 5B:
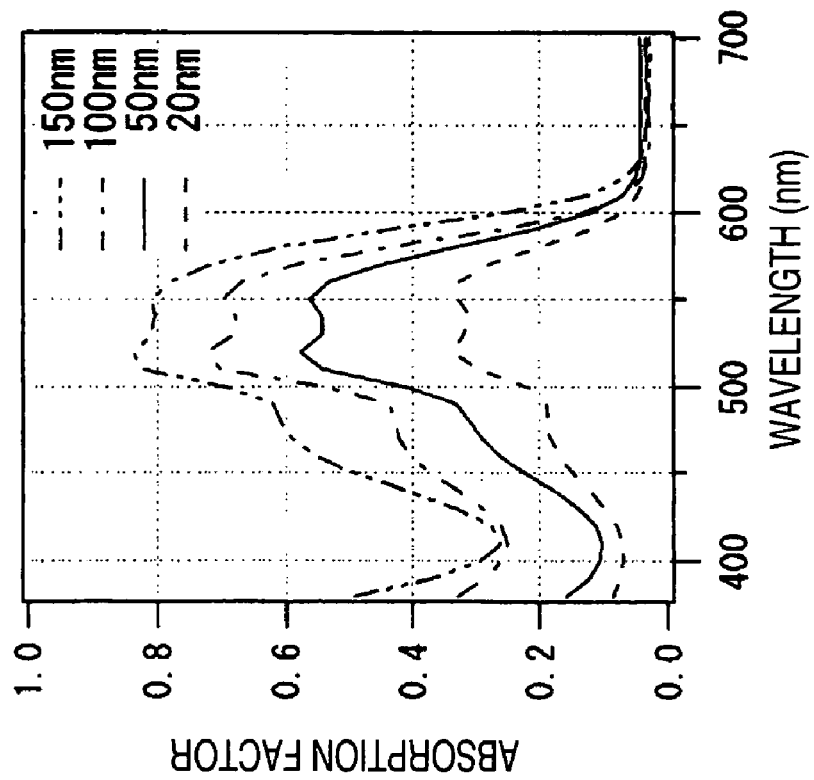

In the photoelectric conversion device 100 having the configuration as illustrated in FIG. 1, when the lower electrode 2 and the upper electrode 4 were each made of ITO, a thickness of the lower electrode 2 was fixed at 100 nm, a thickness of the upper electrode 4 was fixed at 10 nm, and a thickness of the photoelectric conversion layer 3 was varied at 20 nm, 50 nm, 100 nm and 150 nm, an absorption factor in the whole of the photoelectric conversion device 100 and an absorption factor in the photoelectric conversion layer 3 were calculated. The results are shown in FIGS. 5A and 5B. FIG. 5A is a graph to show a relationship between an absorption factor in the whole of the photoelectric conversion device and a wavelength of incident light (absorption spectrum of the whole of the device); and FIG. 5B is a graph to show a relationship between an absorption factor in the photoelectric conversion layer and a wavelength of incident light (absorption spectrum of only the photoelectric conversion layer). In FIG. 5A, since light absorbed in other material than QA is added, the values become larger in proportion as compared with those in FIG. 5B. Incidentally, the calculation was made on the assumption that the light irradiation was carried out from an upper part of the upper electrode 4. In the device of the Comparative Simulation, it is noted that for the purpose of adjusting the absorption factor at 80% or more in the absorption peak wavelength which is a wavelength (G wavelength region) most likely absorbed by QA, the thickness of QA is required to be 150 nm.

(Simulation 1)

Figure 6A:
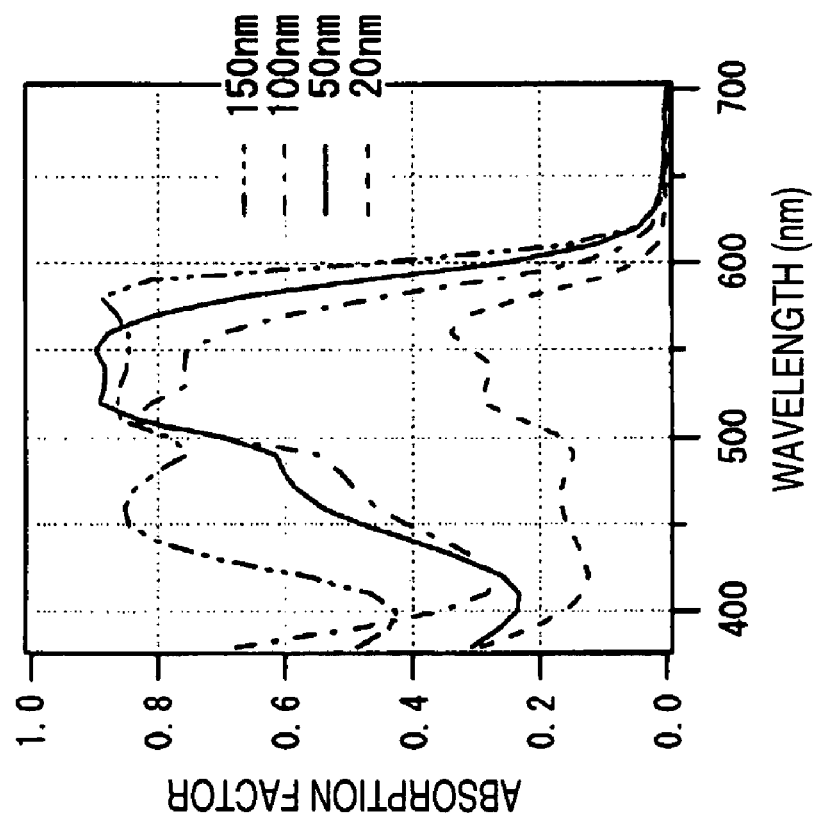
FIGS. 6A and 6B are each a graph to show results of Simulation 1.
Figure 6B:
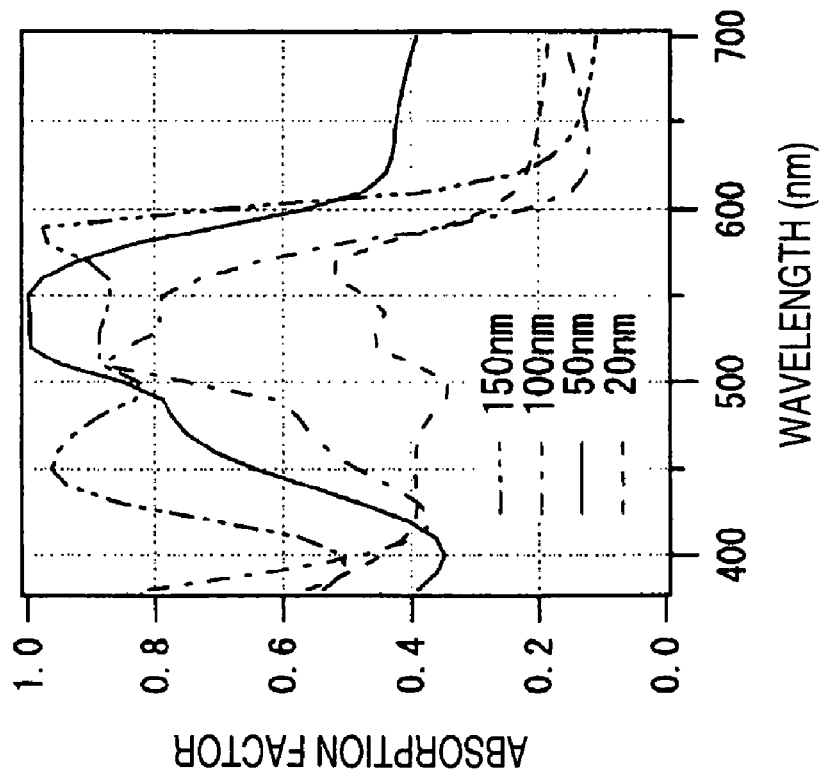

In the device of the Comparative Simulation, an absorption factor was calculated by changing the lower electrode 2 to Al. The results are shown in FIGS. 6A and 6B. FIG. 6A is a graph to show a relationship between an absorption factor in the whole of the photoelectric conversion device and a wavelength of incident light; and FIG. 6B is a graph to show a relationship between an absorption factor in the photoelectric conversion layer and a wavelength of incident light.

(Simulation 2)

Figure 7A:
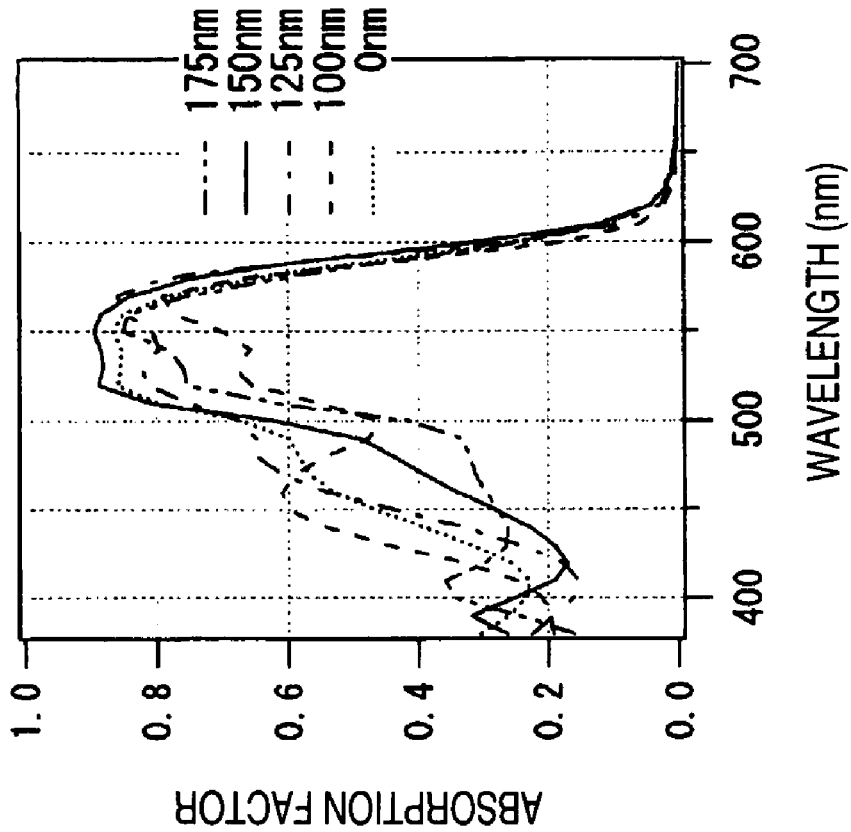
FIGS. 7A and 7B are each a graph to show results of Simulation 2.
Figure 7B:
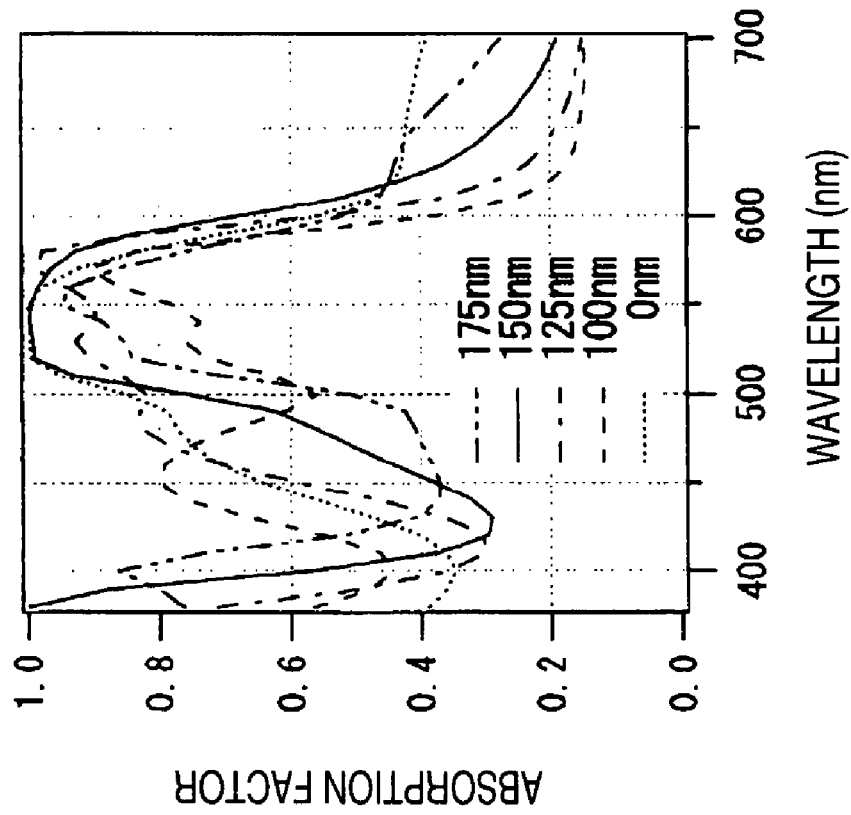

In the device of the Simulation 1, an absorption factor was calculated by fixing the thickness of the photoelectric conversion layer 3 at 50 nm, supplementing m-MTDATA as a smoothing layer between the photoelectric conversion layer 3 and the upper electrode 4 and varying a thickness of this smoothing layer at 0 nm, 100 nm, 125 nm, 150 nm and 175 nm. The results are shown in FIGS. 7A and 7B. FIG. 7A is a graph to show a relationship between an absorption factor in the whole of the photoelectric conversion device and a wavelength of incident light; and FIG. 7B is a graph to show a relationship between an absorption factor in the photoelectric conversion layer and a wavelength of incident light.

(Simulation 3)

Figure 8A:
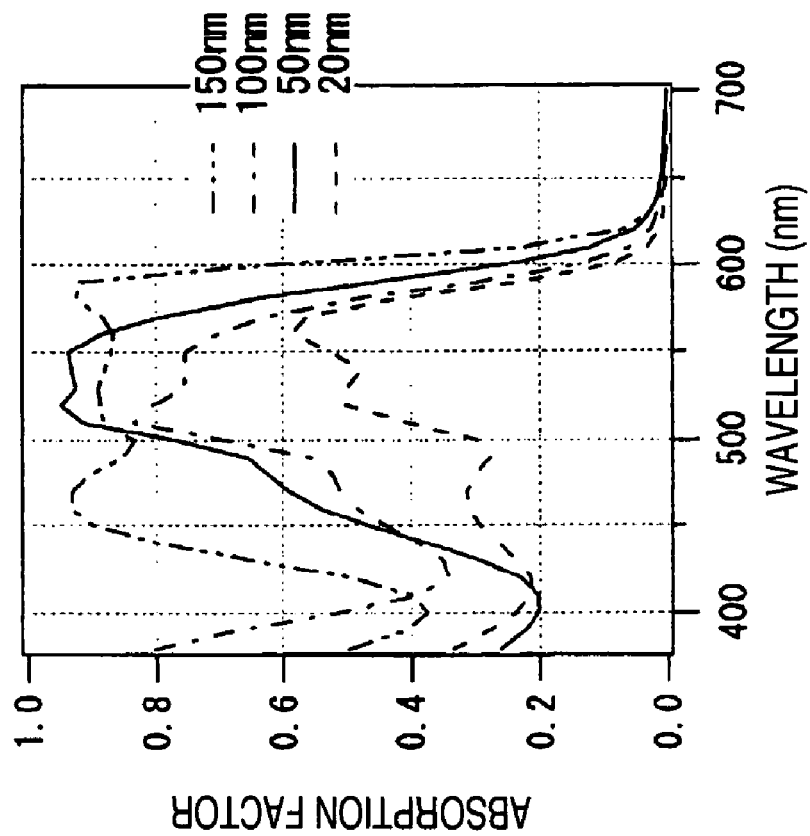
FIGS. 8A and 8B are each a graph to show results of Simulation 3.
Figure 8B:
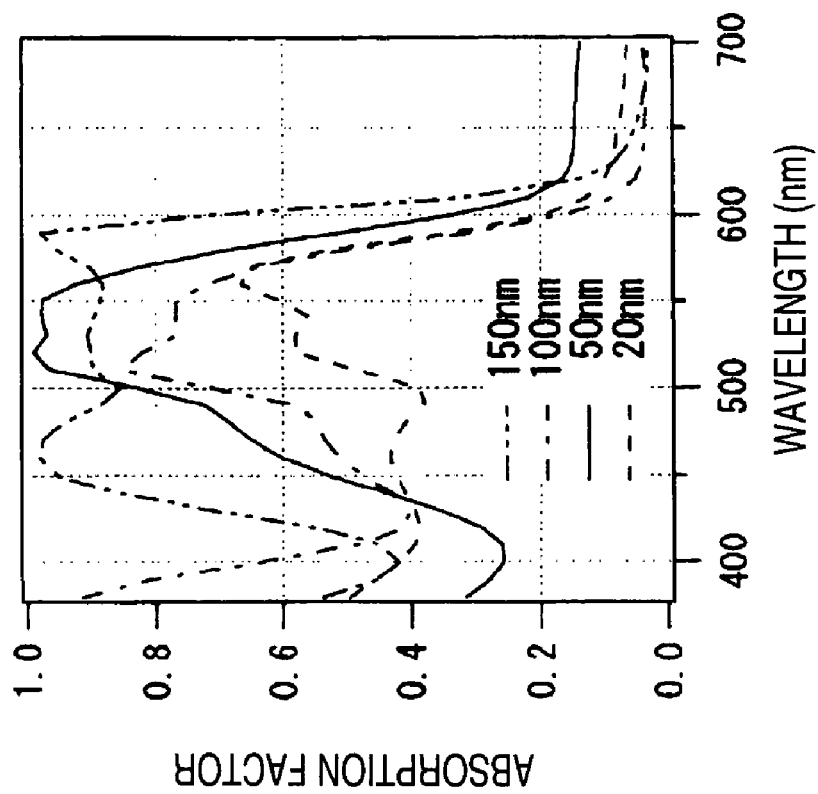

In the device of the Comparative Simulation, an absorption factor was calculated by changing the lower electrode 2 to Ag. The results are shown in FIGS. 8A and 8B. FIG. 8A is a graph to show a relationship between an absorption factor in the whole of the photoelectric conversion device and a wavelength of incident light; and FIG. 8B is a graph to show a relationship between an absorption factor in the photoelectric conversion layer and a wavelength of incident light.

(Simulation 4)

Figure 9A:
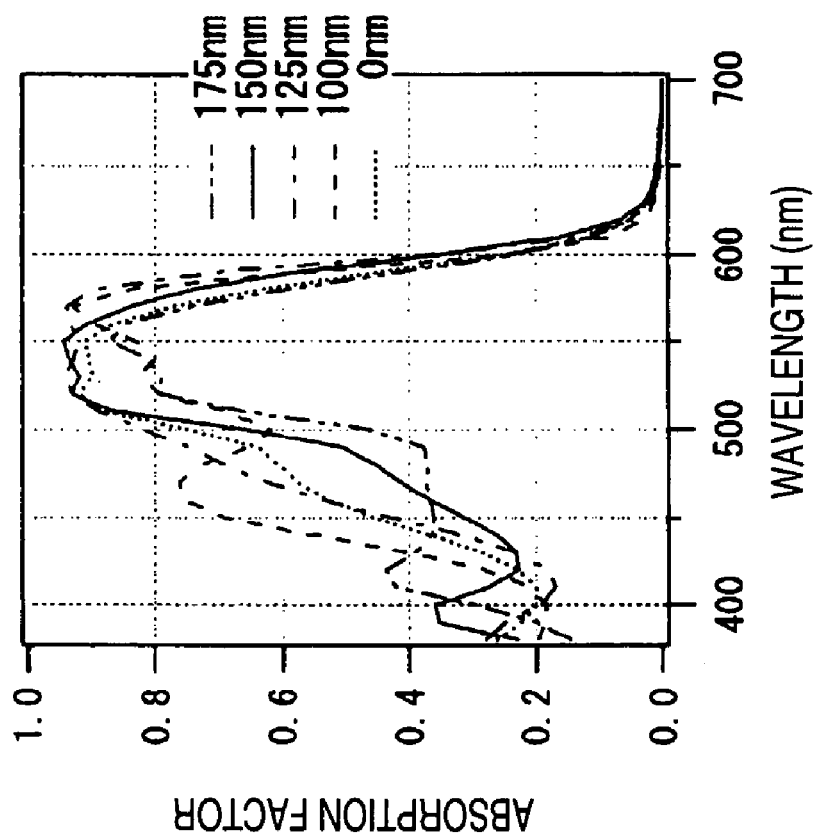
FIGS. 9A and 9B are each a graph to show results of Simulation 4.
Figure 9B:
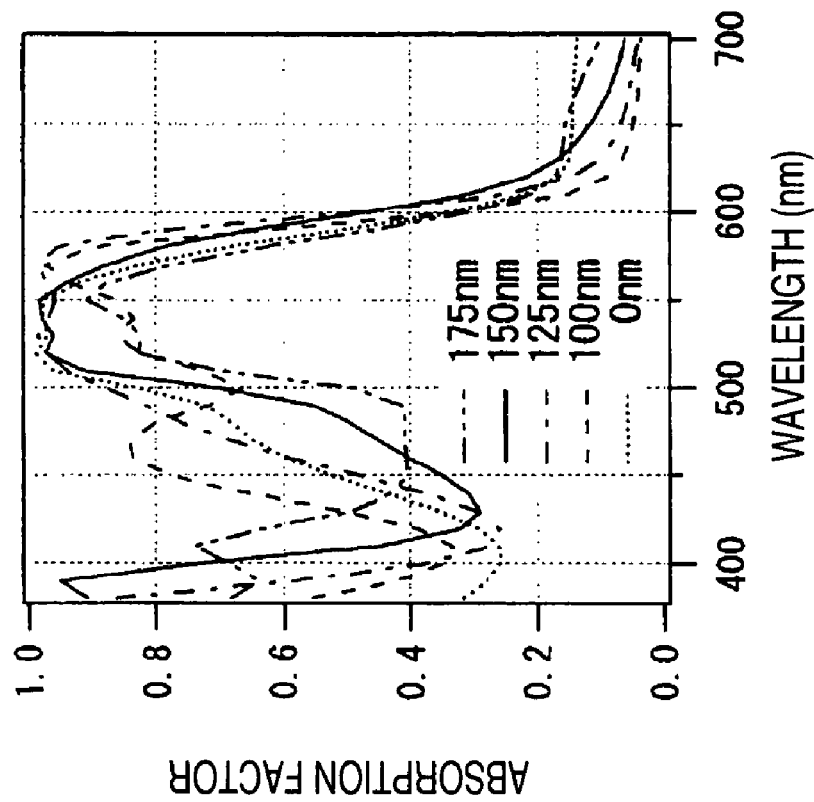

In the device of the Simulation 3, an absorption factor was calculated by fixing the thickness of the photoelectric conversion layer 3 at 50 nm, supplementing m-MTDATA as a smoothing layer between the photoelectric conversion layer 3 and the upper electrode 4 and varying a thickness of this smoothing layer at 0 nm, 100 nm, 125 nm, 150 nm and 175 nm. The results are shown in FIGS. 9A and 9B. FIG. 9A is a graph to show a relationship between an absorption factor in the whole of the photoelectric conversion device and a wavelength of incident light; and FIG. 9B is a graph to show a relationship between an absorption factor in the photoelectric conversion layer and a wavelength of incident light.

(Simulation 5)

Figure 10A:
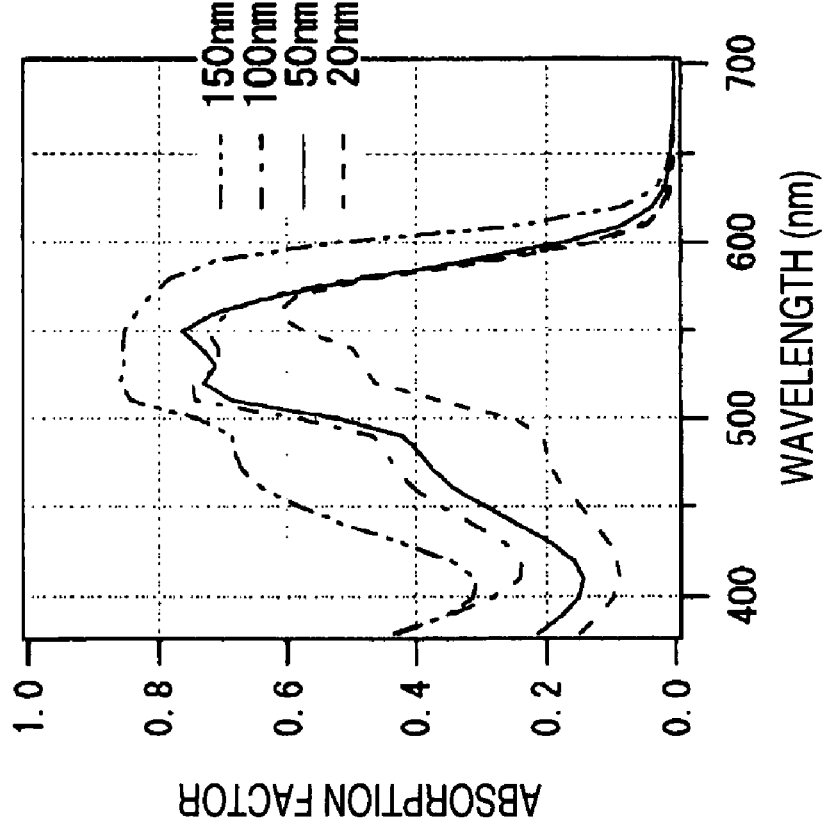
FIGS. 10A and 10B are each a graph to show results of Simulation 5.
Figure 10B:
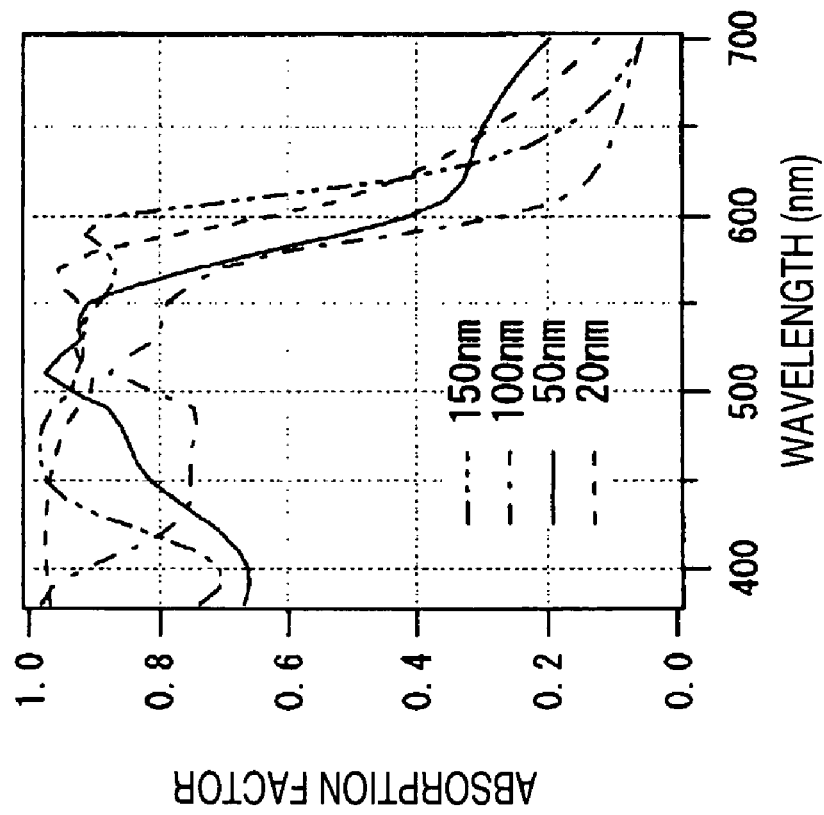

In the device of the Comparative Simulation, an absorption factor was calculated by changing the lower electrode 2 to Au. The results are shown in FIGS. 10A and 10B. FIG. 10A is a graph to show a relationship between an absorption factor in the whole of the photoelectric conversion device and a wavelength of incident light; and FIG. 10B is a graph to show a relationship between an absorption factor in the photoelectric conversion layer and a wavelength of incident light.

(Simulation 6)

Figure 11A:
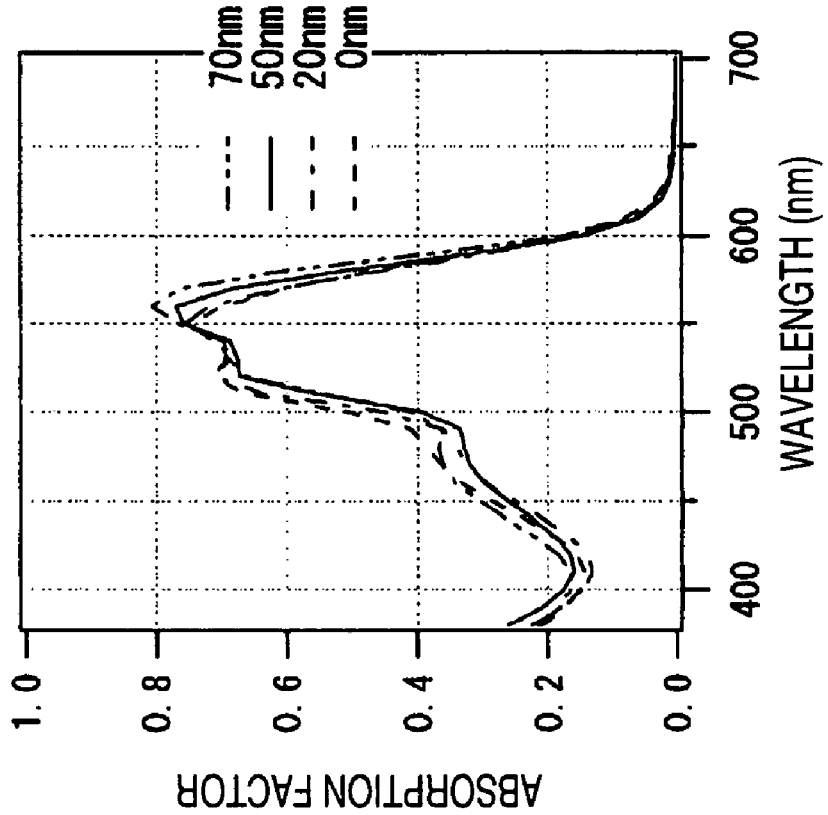
FIGS. 11A and 11B are each a graph to show results of Simulation 6.
Figure 11B:
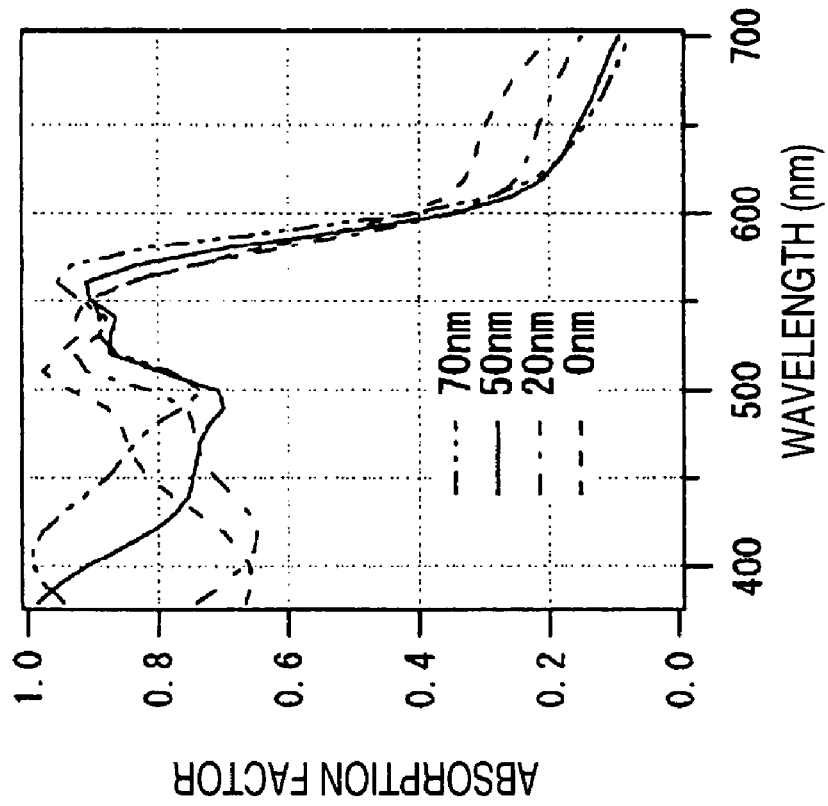

In the device of the Simulation 5, an absorption factor was calculated by fixing the thickness of the photoelectric conversion layer 3 at 50 nm, supplementing $Alq_3$ as a smoothing layer between the photoelectric conversion layer 3 and the upper electrode 4 and varying a thickness of this smoothing layer at 0 nm, 20 nm, 50 nm and 70 nm. The results are shown in FIGS. 11A and 11B. FIG. 11A is a graph to show a relationship between an absorption factor in the whole of the photoelectric conversion device and a wavelength of incident light; and FIG. 11B is a graph to show a relationship between an absorption factor in the photoelectric conversion layer and a wavelength of incident light.

As is clear from FIGS. 5A and 5B, in the case where the lower electrode 2 is transparent, for the purpose of adjusting the absorption factor at approximately 80% in the absorption peak wavelength of QA, the thickness of QA is required to be approximately 150 nm. However, when the thickness of QA is made thick as 150 nm or more, since carrier transport properties of QA are low (in particular, electron transport properties are low), it is impossible to sufficiently transfer an electron generated by the optical absorption to the electrode, resulting in hindering external quantum efficiency as the device.

On the other hand, as shown in FIGS. 6A and 6B to 11A and 11B, according to the devices of the Simulations 1 to 6, even when the thickness of QA is made thin, it is possible to increase the absorption factor as compared with that of the device of the Comparative Simulation. On review of the results as shown in FIGS. 6A and 6B to 9A and 9B, it is noted that even when the thickness of QA is 50 nm, approximately 90% of G light can be absorbed by QA. So far as this thin layer thickness is concerned, lowness of the electron transport properties of the QA layer can be covered to some extent. Similarly, on review of the results as shown in FIGS. 10A and 10B and 11A and 11B, it is noted that even when the thickness of QA is 50 nm, approximately 70% of G light can be absorbed by QA.

Furthermore, taking into consideration the peak height of absorption factor and the spectral waveform, and further taking into consideration the matter that the smoothing layer is required to have a thickness to some extent from the viewpoint of preventing the generation of a short circuit, when the thickness of m-MTDATA is approximately 150 nm, the absorption factor of G light is high so that it can be judged that such is suitable. In that case, the absorption factor of G light in QA was about 90%.

Second Embodiment

In the present embodiment, a solid-stage imaging device using any one of the photoelectric conversion devices 100 to 400 described in the first embodiment is described.

FIG. 12 is a schematic cross-sectional view of a portion of one pixel of a solid-state imaging device using the photoelectric conversion device described in the first embodiment. In this solid-state imaging device 500, the one pixel as illustrated in FIG. 12 is disposed in a plural number in an array state on the same plane, and one pixel data of image data can be produced by a signal as obtained from this one pixel.

One pixel of the solid-state imaging device 500 as illustrated in FIG. 12 is configured such that one photoelectric conversion device described in any one of FIGS. 1 to 4 is provided on the upper side of a semiconductor substrate such as silicon and that a charge generated in the subject photoelectric conversion device is read out by a signal read-out part formed on the semiconductor substrate. In FIG. 12, for the purpose of simplifying the illustration, only a lower electrode, a photoelectric conversion layer and an upper electrode are illustrated as the photoelectric conversion device provided on the upper side of the semiconductor substrate.

In one pixel of the solid-state imaging device 500, a photoelectric conversion device including a p-type silicon substrate 10, a lower electrode 15 on the upper side of the p-type silicon substrate 10, a photoelectric conversion layer 16 formed on the lower electrode 15 and an upper electrode 17 formed on the photoelectric conversion layer 16 is formed such that the lower electrode 15 is faced towards a side of the p-type silicon substrate 10. The lower electrode 15 is corresponding to the lower electrode 2 as illustrated in each of FIGS. 1 to 4; the photoelectric conversion layer 16 is corresponding to the photoelectric conversion layer 3 as illustrated in each of FIGS. 1 to 4; and the upper electrode 17 is corresponding to the upper electrode 4 as illustrated in each of FIGS. 1 to 4. The lower electrode 15 is divided for every pixel. The upper electrode 17 may be divided for every pixel or may be commonly used in all pixels.

An n-type high-density impurity region (n+ region) 11 is formed within the p-type silicon substrate 10. A signal read-out part (not illustrated) for reading out a signal corresponding to a charge stored in the n+ region 11 and made of CCD or a CMOS circuit or the like is formed in the p-type silicon substrate 10. A connection part 14 for electrically connecting the n+ region 11 and the lower electrode 15 to each other and made of a metal or the like is formed on the n+ region 11. A dielectric layer 13 is formed between the silicon substrate 10 and the lower electrode 15; and a light-shielding layer 12 for preventing the incidence of light into the connection part 14 and the signal read-out part is formed within this dielectric layer 13. When the dielectric layer is opaque, the light-shielding layer 12 may not be provided. A transparent dielectric layer 18 is formed on the upper electrode 17.

A number of pixels configuring the solid-state imaging device 500 include three kinds of pixels of an R pixel for detecting R light, a G pixel for detecting G light, and a B pixel for detecting B light. The photoelectric conversion layer 16 included in the R pixel is constituted of a material for absorbing R light and generating a charge corresponding thereto. The photoelectric conversion layer 16 included in the G pixel is constituted of a material for absorbing G light and generating a charge corresponding thereto. The photoelectric conversion layer 16 included in the B pixel is constituted of a material for absorbing B light and generating a charge corresponding thereto.

These three kinds of pixels are disposed in a prescribed disposition pattern. As this disposition pattern, for example, a Bayer-like disposition as illustrated in FIG. 13A and a stripe-like disposition as illustrated in FIG. 13B can be employed. In FIGS. 13A and 13B, a square represents a pixel, and a symbol within the square represents a color to be detected in the subject pixel.

Incidentally, here, though the solid-stage imaging device 500 is configured of three kinds of pixels, the number of kinds of pixel may be two or more. Furthermore, the kind of pixel is not limited to the foregoing pixel for detecting light of a primary color system, but a pixel for detecting light of a complementary color system may be employed.

In the case where an organic material is used as the photoelectric conversion layer 16 of each pixel of the solid-state imaging device 500 as illustrated in FIG. 12, its manufacturing method must be devised. This is because an organic material is weak against heat or moisture or the like, and when the photoelectric conversion layer 16 is formed by a photolithographic method likewise a color filter of a single-plate solid-state imaging device, the performance of the photoelectric conversion layer 16 is deteriorated. Then, it is effective that a material constituting the photoelectric conversion layer 15 is vapor deposited at a prescribed position on the already formed lower electrode 16 via a mask such as a metallic mask, thereby forming the photoelectric conversion layer 16.

For example, after forming the lower electrode 15, a photoelectric conversion material for absorbing R light is vapor deposited via a metallic mask r in which an opening is formed at a position at which the photoelectric conversion layer 16 for absorbing R light is to be formed. Next, a photoelectric conversion material for absorbing G light is vapor deposited via a metallic mask g in which an opening is formed at a position at which the photoelectric conversion layer 16 for absorbing G light is to be formed. Finally, a photoelectric conversion material for absorbing B light is vapor deposited via a metallic mask b in which an opening is formed at a position at which the photoelectric conversion layer 16 for absorbing B light is to be formed, whereby the photoelectric conversion layers 16 for absorbing R light, G light and B light, respectively may be formed on the same plane. The photoelectric conversion layer 16 can be thus formed without employing a photolithographic method.

In this way, in the case where the photoelectric conversion layer 16 is formed via a mask, so far as the disposition pattern as illustrated in FIG. 13B is concerned, the same masks are used as the metallic masks r, g and b, respectively, these masks are one-dimensionally deviated in a lateral direction, and different materials are merely vapor deposited, whereby a number of photoelectric conversion layers 16 can be formed. Accordingly, the manufacture is easy as compared with the disposition pattern as illustrated in FIG. 13A.

Incidentally, with respect to the photoelectric conversion layers for absorbing R light, G light and B light, respectively, in the case where the optimum thickness of the smoothing layer is equal, the smoothing layer can be fabricated all at once without using a mask. In that case, since the manufacture is easy and irregularities between the respective photoelectric conversion layers can be relieved, a problem such as the generation of a short circuit of pixel and an increase in leak current can be reduced.

Next, what effects are obtained by bringing the lower electrode 2 with a function to reflect light are described on the basis of experimental results obtained by actually preparing a photoelectric conversion device.

Comparative Example 1

Figure 14:
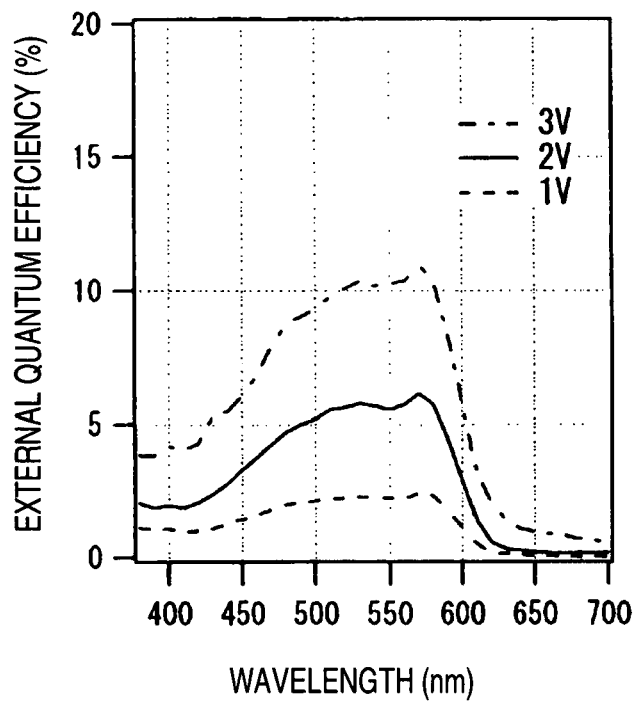
FIG. 14 is a graph to show results of Comparative Example 1.

100 nm of ITO was deposited on a substrate, and 2 nm of In was vapor deposited thereon to form a lower electrode having a work function of not more than 4.5 eV. 100 nm of quinacridone (QA) was deposited thereon to form a photoelectric conversion layer; 100 nm of m-MTDATA was deposited thereon to form a smoothing layer; and 10 nm of ITO was deposited thereon to form an upper electrode, thereby preparing a photoelectric conversion device. An action spectrum which is a relationship between a wavelength of incident light and external quantum efficiency when light having a wavelength of 550 nm and an intensity of 50 µW/cm$^2$ is made incident into this photoelectric conversion device from the upper electrode is shown in FIG. 14. As shown in FIG. 14, it is noted that when 2 V of a bias voltage is applied between the upper electrode and the lower electrode, about 6% of external quantum efficiency is obtained at an absorption peak wavelength of QA.

Example 1

Figure 15:
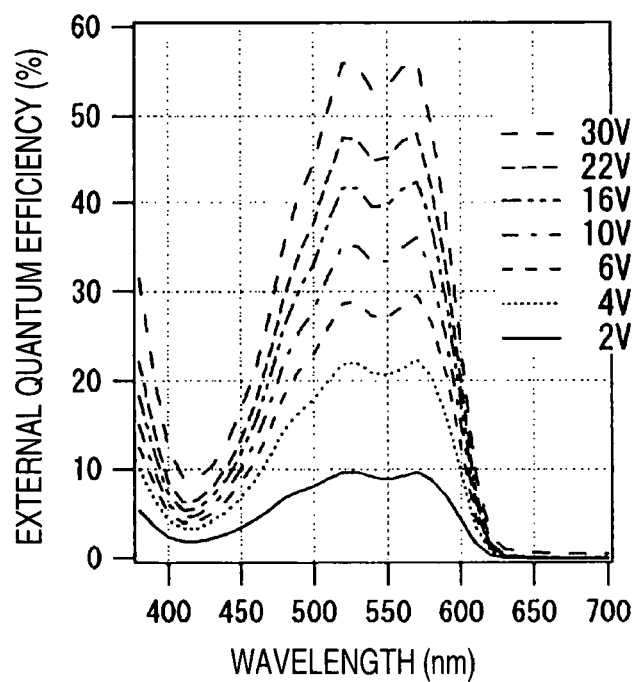
FIG. 15 is a graph to show results of Example 1.
Figure 16:
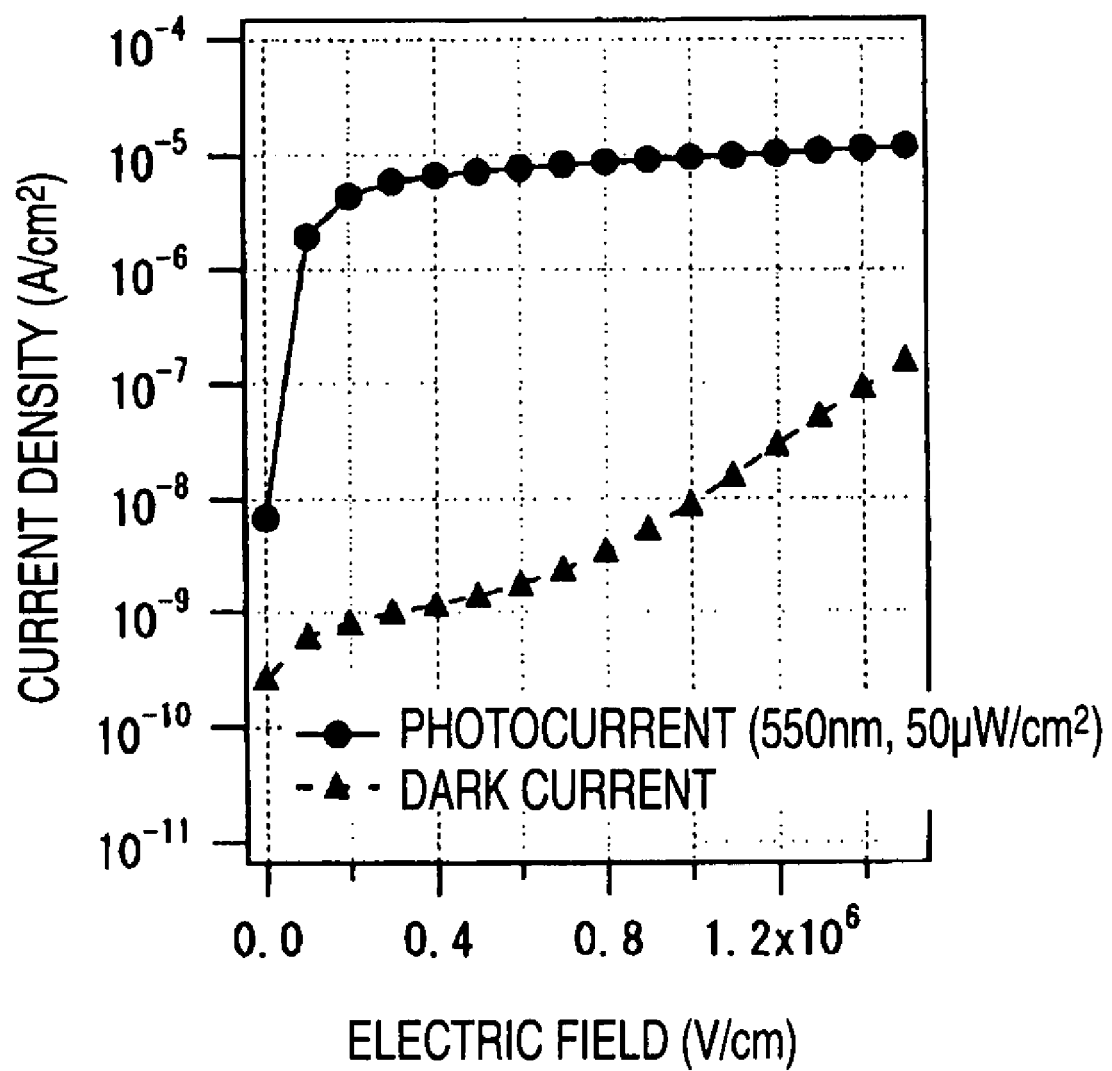
FIG. 16 is a graph to show results of Example 1.

100 nm of Al was deposited on a substrate to form a lower electrode; 50 nm of quinacridone (QA) was deposited thereon to form a photoelectric conversion layer; 150 nm of m-MTDATA was deposited thereon to form a smoothing layer; and 10 nm of ITO was deposited thereon to form an upper electrode, thereby preparing a photoelectric conversion device. A mean surface roughness Ra of the surface of m-MTDATA after the deposition of m-MTDATA is about 0.8 nm. An action spectrum which is a relationship between a wavelength of incident light and external quantum efficiency when light having a wavelength of 550 nm and an intensity of 50 µW/cm$^2$ is made incident into this photoelectric conversion device from the upper electrode is shown in FIG. 15. Furthermore, a relationship between an average electric field applied to the interlayer of this photoelectric conversion device and a photocurrent or a dark current is shown in FIG. 16.

Since the device of this Example 1 is identical in the thickness of the interlayer with the device of Comparative Example 1, the external quantum efficiency is compared at the same bias voltage. It is noted that in the device of Example 1, nevertheless the thickness of QA is thin as 50 nm, the external quantum efficiency at the applied voltage of 2 V is high as about 10%. When the bias voltage is increased, the external quantum efficiency becomes further large, and for example, in the case where 16 V is applied, the dark current is 3 nA/cm$^2$, and the external quantum efficiency is 42%. Furthermore, it is noted that though a half value width of the action spectrum of the device of Comparative Example 1 is about 150 nm, a half value width of the action spectrum of the device of Example 1 is about 120 nm so that the half value width becomes small due to the effect of optical interference.

Figure 17:
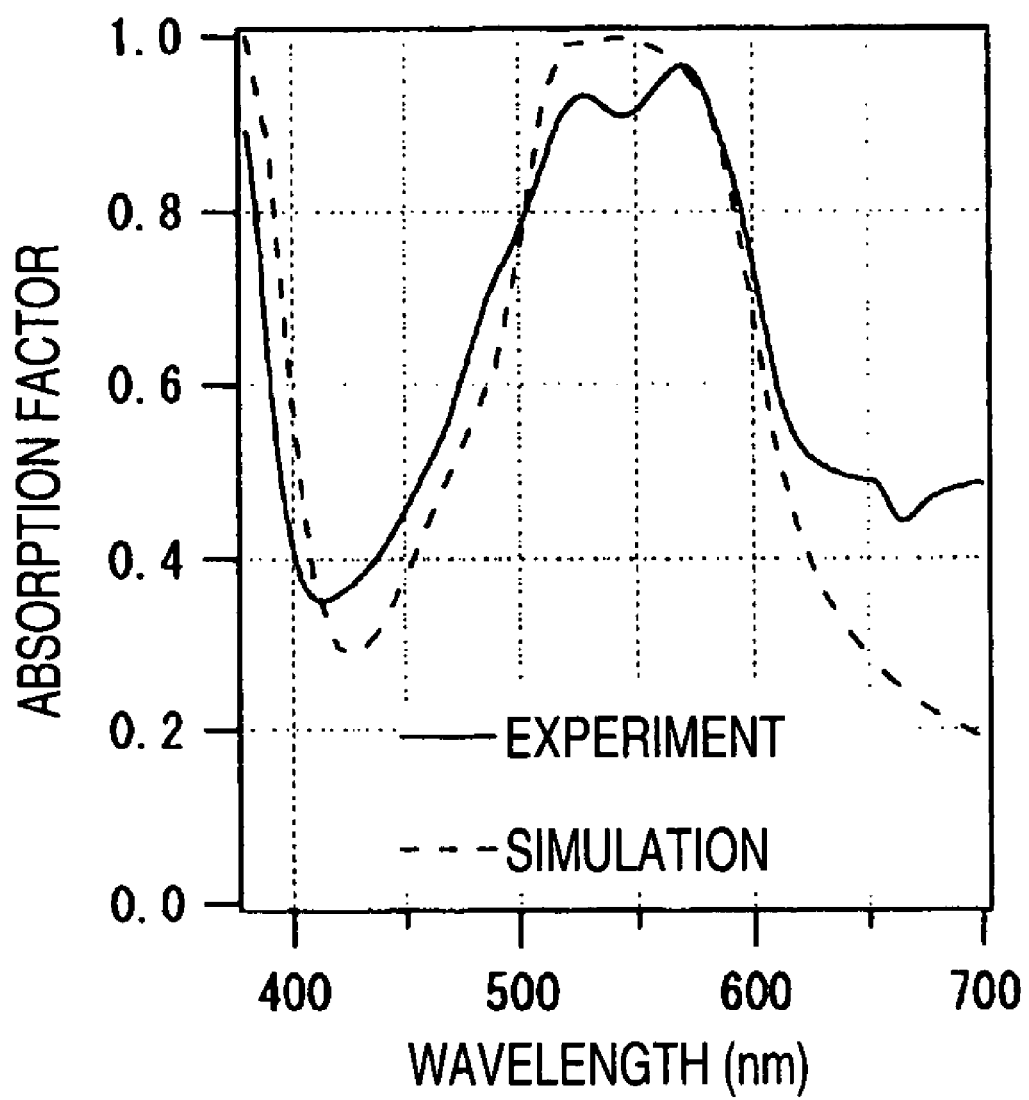
FIG. 17 is a graph to show results of actually measuring an absorption factor of the device of Example 1.

FIG. 17 shows the results obtained by actually measuring an absorption factor of the device of Example 1. The measurement was carried out by condensing reflected light by a spectrophotometer provided with an integrating sphere. It is noted that though values in a long wavelength region derived due to plasmon absorption of Al are deviated, the values in other wavelength regions are substantially coincident with the calculation results shown in FIG. 7A (it is thought that the deviation in a long wavelength region is caused due to the matter that the value described in the literature reference of an optical constant of Al is not precise). It can be confirmed from this matter that by bringing the lower electrode with a function to reflect light, the absorption factor of this device in an absorption peak wavelength reaches 90% or more. Accordingly, it can be thought that the matter that nevertheless the photoelectric conversion layer is thin, the external quantum efficiency was improved is caused due to the effect that the absorption factor became large by bringing the lower electrode with a function to reflect light. In addition to this, in the case where the photoelectric conversion layer is thin, there is also included an effect that efficiency for collecting a carrier (especially an electron) generated due to the optical absorption increases.

Example 2

Figure 18:
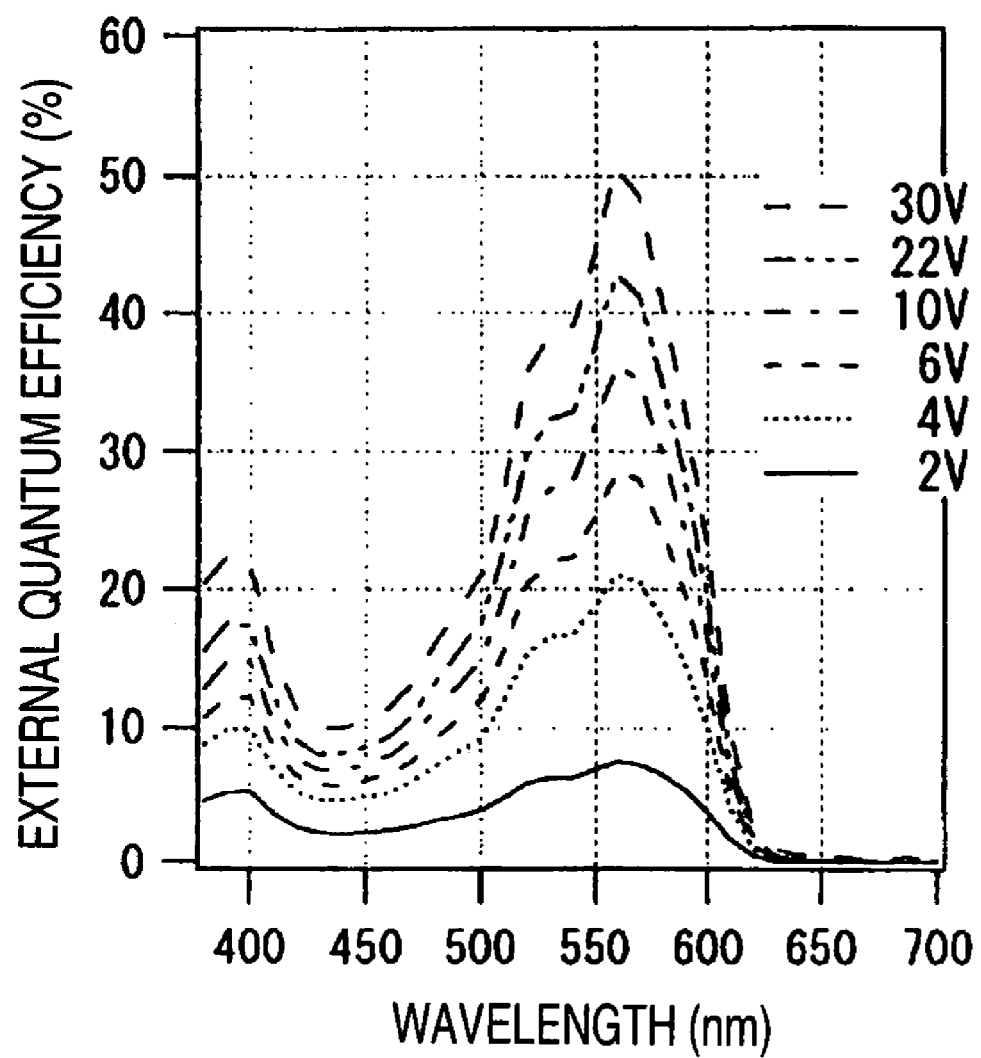
FIG. 18 is a graph to show results of Example 2.

A photoelectric conversion device was prepared in exactly the same manner as in Example 1, except that in Example 1, the layer thickness of m-MTDATA was changed to 175 nm. A mean surface roughness Ra of the surface of m-MTDATA after the deposition of m-MTDATA is about 0.8 nm. An action spectrum which is a relationship between a wavelength of incident light and external quantum efficiency when light having a wavelength of 550 nm and an intensity of 50 μW/cm² is made incident into this photoelectric conversion device from the upper electrode is shown in FIG. 18.

In comparison with the device of Example 1, in the device of Example 2, a peak value of the external quantum efficiency at the same bias became slightly small. It is thought that this was caused due to the matter that the layer thickness became slightly thick. Noticeably, a half value width of the action spectrum became decreased significantly and was sharpened. The half value width becomes small to an extent of approximately 90 nm.

The foregoing results can also be expected from the calculation results of the Simulation 2 as shown in FIG. 7B. In comparison with the case where the layer thickness of m-MTDATA is 150 nm, in the case where the layer thickness of m-MTDATA is 175 nm, it is noted that though the absorption in the photoelectric conversion layer becomes very slightly small, the half value width becomes decreased significantly. In this way, by utilizing the effect of optical interference, the half value width can be varied. It is demonstrated that by properly designing the layer thickness of m-MTDATA, the half value width of the action spectrum can be made decreased. It is thought that a technology for controlling a half value width is especially important for an imaging device in which a spectral sensitivity characteristic is important.

An effect for inhibiting a dark current by adjusting a work function of the electrode for collecting electrons described in each of the foregoing embodiments at not more than 4.5 eV is hereunder demonstrated with reference to the following Examples.

Comparative Example 2

There is enumerated the case of collecting electrons in a side of an ITO electrode by a structure in which quinacridone having a thickness of 100 nm and an Al upper electrode (work function determined by a photoelectron spectrometer in air AC-2, manufactured by Riken Keiki Co., Ltd.: 4.3 eV, light transmittance in visible region: 0%) having a thickness of 100 nm are stacked in this order on a glass substrate (a commercial product) having stacked thereon an ITO electrode (4.8 eV, light transmittance in visible region: about 90%) having a thickness of 250 nm by vacuum vapor deposition. As a result of actually preparing a device having a device area of 2 mm×2 mm and measuring it, a dark current became a large value as 9.3 μA/cm² at the time of applying a voltage of 1 V. In that case, it is thought that since the work function of the ITO electrode which is an electrode for collecting electrons is large, the injection of a hole from the ITO electrode into the quinacridone is easy to occur at the time of applying a bias voltage and that the dark current becomes large.

Example 3

A device was prepared in the same manner as in Comparative Example 2, except for stacking In having a small work function as 4.3 eV in a thickness of 2 nm on the ITO electrode and mediating In between the quinacridone and the ITO electrode by vacuum vapor deposition (light transmittance in visible region of 2 nm-thick In: about 98%). As a result, the dark current at the applied voltage of 1 V was 1.8 nA/cm and was largely suppressed by about four digits. This demonstrates that by making the work function of the ITO electrode which is an electrode for collecting electrons small, the injection of a hole from the electrode for collecting electrons was largely suppressed. Light of 550 nm was made incident from a side of the ITO electrode at an irradiation intensity of 50 μW/cm² under the same condition of applying a bias of 1 V. As a result, external quantum efficiency (the number of measured charges to the number of incident photons) was 12%. Furthermore, a dark current was about 100 nA/cm², and external quantum efficiency was 19% at the applied bias of 2 V.

Example 4

A device was prepared in the same manner as in Example 3, except that in the device of Example 3, the Al electrode was replaced by an ITO electrode (work function: 4.8 eV, light transmittance in visible region: about 98%) to adjust the work function of the electrode for collecting holes. Here, the ITO transparent electrode formed in place of the Al electrode was deposited in a thickness of 10 nm on the organic layer at 40 W by RF magnetron sputtering. At this sputter deposition of ITO, though in some devices, a short circuit was generated due to damages on the organic layer by plasma, the measurement was performed with respect to devices which could be subjected to fabrication without generating a short circuit. Light was made incident at the applied voltage of 2 V under the same condition as in Example 3. As a result, a dark current was 40 nA/cm², and external quantum efficiency was 42%.

In comparison with Example 3, a further reduction of the dark current (100 nA/cm² ⇒40 nA/cm² at the applied bias of 2 V) was confirmed. Furthermore, light was made incident under the same condition as in Example 3. As a result, an improvement of the external quantum efficiency (19% ⇒42% at the applied bias of 2 V) was confirmed.

A bias voltage for applying a certain fixed electric field in the inside of the interlayer varies depending upon a combination of electrodes interposing the interlayer therebetween. For example, in comparison with the device of Comparative Example 2 in which the work function of the electrode for collecting electrons is adjusted at 4.8 eV and the work function of the electrode for collecting holes is adjusted at 4.3 eV and the device of Example 3 in which the work function of the electrode for collecting electrons is adjusted at 4.3 eV and the work function of the electrode for collecting holes is adjusted at 4.3 eV, according to the device of Example 4 in which the work function of the electrode for collecting electrons is adjusted at 4.3 eV and the work function of the electrode for collecting holes is adjusted at 4.8 eV, an electric field of the same degree can be applied in the inside of the interlayer at a low bias. In this way, realization of a low bias can be expected. Actually, according to the device of Example 4, external quantum efficiency of 19% is obtained at a bias of 1.5 V, and in comparison with the device of Example 3, the external quantum efficiency of the same degree is obtained at a low bias. In this way, in the case where the electrode in the light incident side is an electrode for collecting electrons, it has been noted that by adjusting the work function of the electrode for collecting electrons at not more than 4.5 eV and the work function of the electrode for collecting holes at 4.5 eV or more, respectively, not only the dark current but also the bias voltage can be inhibited.

This application is based on Japanese Patent application JP 2006-100627, filed Mar. 31, 2006, the entire content of which is hereby incorporated by reference, the same as if set forth at length.

What is claimed is:

1. A photoelectric conversion device comprising a lower electrode adjacent a substrate, an upper electrode opposing to the lower electrode and a photoelectric conversion layer provided between the lower electrode and the upper electrode, the photoelectric conversion device being for collecting a photocurrent upon application of a bias voltage between the lower electrode and the upper electrode,
wherein
the upper electrode works as an electrode in a light incident side,
the upper electrode is transparent, and
the lower electrode is a metallic electrode having a function to reflect light; and further comprising a smoothing layer for reducing roughness of a surface of the photoelectric conversion layer provided between the photoelectric conversion layer and the upper electrode.

2. The photoelectric conversion device according to claim 1, further comprising a transparent electrode between the lower electrode and the photoelectric conversion layer.

3. The photoelectric conversion device according to claim 1, wherein the bias voltage is from 0.1 V to 30 V.

4. The photoelectric conversion device according to claim 1, wherein the photoelectric conversion layer contains an organic photoelectric conversion material.

5. The photoelectric conversion device according to claim 4, wherein the organic photoelectric conversion material comprises at least one of a material having a quinacridone skeleton, a material having a phthalocyanine skeleton and a material having an anthraquinone skeleton.

6. The photoelectric conversion device according to claim 1, wherein an absorption factor of a whole of the photoelectric conversion device against incident light is 80% or more in an absorption peak wavelength of the photoelectric conversion layer.

7. The photoelectric conversion device according to claim 1, wherein a half value width of an action spectrum of the photoelectric conversion device against incident light is not more than 130 nm.

8. The photoelectric conversion device according to claim 1, wherein the photoelectric conversion layer has a thickness of not more than 100 nm.

9. The photoelectric conversion device according to claim 1, wherein the smoothing layer comprises an amorphous material.

10. The photoelectric conversion device according to claim 1, wherein a mean surface roughness Ra of a surface of the smoothing layer is not more than 1 nm.

11. The photoelectric conversion device according to claim 1, wherein the smoothing layer comprises an organic material.

12. The photoelectric conversion device according to claim 1, wherein the smoothing layer is transparent.

13. The photoelectric conversion device according to claim 1, wherein the smoothing layer has a thickness of from 10 to 200 nm.

14. The photoelectric conversion device according to claim 1, wherein the upper electrode is a layer comprising a transparent conducting oxide.

15. The photoelectric conversion device according to claim 14, wherein the transparent conducting oxide is ITO.

16. The photoelectric conversion device according to claim 1, wherein the upper electrode is a metallic layer formed by vapor deposition.

17. The photoelectric conversion device according to claim 1, wherein the upper electrode has a thickness of from 5 to 200 nm.

18. The photoelectric conversion device according to claim 1, wherein a mean surface roughness Ra of a surface of the lower electrode is not more than 3 nm.

19. The photoelectric conversion device according to claim 1, wherein the lower electrode works as an electrode for collecting electrons, and the upper electrode works as an electrode for collecting holes.

20. The photoelectric conversion device according to claim 1, wherein the lower electrode works as an electrode for collecting electrons, the upper electrode works as an electrode for collecting holes, and the smoothing layer comprises a hole transporting material.

21. The photoelectric conversion device according to claim 20, wherein the hole transporting material is a material having a triphenylamine structure.

22. The photoelectric conversion device according to claim 21, wherein the hole transporting material is a material having a starburst amine structure.

23. The photoelectric conversion device according to claim 19, wherein a work function of the lower electrode is not more than 4.5 eV.

24. The photoelectric conversion device according to claim 23, wherein the lower electrode contains a metallic material selected from Ag, Al, Ca, In, Mg, Mn, Ta, Ti, V and W.

25. The photoelectric conversion device according to claim 1, wherein the lower electrode works as an electrode for collecting holes, and the upper electrode works as an electrode for collecting electrons.

26. The photoelectric conversion device according to claim 1, wherein the lower electrode works as an electrode for collecting holes, the upper electrode works as an electrode for collecting electrons, and the smoothing layer comprises an electron transporting material.

27. The photoelectric conversion device according to claim 26, wherein the electron transporting material is $Alq_3$ or a derivative thereof.

28. The photoelectric conversion devices according to claim 25, wherein a work function of the lower electrode is 4.5 eV or more.

29. The photoelectric conversion device according to claim 28, wherein the lower electrode contains a metallic material selected from Au, Co, Fe, Mo, Pd and Pt.

30. The photoelectric conversion device according to claim 25, wherein a work function of the upper electrode is not more than 4.5 eV.

31. The photoelectric conversion device according to claim 30, wherein the upper electrode is made from Cs-doped ITO.

32. A solid-state imaging device comprising:
a semiconductor substrate;
a plurality of the photoelectric conversion devices according to claim 1 disposed in an array state on a same plane on the upper side of the semiconductor substrate; and
a signal read-out part for reading out a signal corresponding to a signal charge generated in each of the plurality of photoelectric conversion devices.

33. The solid-state imaging device according to claim 32, wherein the signal read-out part is made from a CMOS circuit or CCD provided in the semiconductor substrate.

34. The solid-state imaging device according to claim 32, wherein a plurality of photoelectric conversion layers contained in the plurality of photoelectric conversion devices include plural kinds of photoelectric conversion layers each of which absorbs light of a different wavelength region to generate a charge corresponding thereto.

35. The solid-state imaging device according to claim 34, wherein
the plurality of photoelectric conversion layers contained in the plurality of photoelectric conversion devices include three kinds of photoelectric conversion layers each of which absorbs light of a different wavelength region to generate a charge corresponding thereto, and the three kinds of photoelectric conversion layers are disposed in a mosaic state.

36. The solid-state imaging device according to claim 34, wherein the plurality of photoelectric conversion layers contained in the plurality of photoelectric conversion devices include three kinds of photoelectric conversion layers each of which absorbs light of a different wavelength region to generate a charge corresponding thereto, and the three kinds of photoelectric conversion layers are disposed in a stripe state.

37. A method for manufacturing the solid-state imaging device according to claim 34, which comprises:

depositing materials for forming the photoelectric conversion layers on the same plane on the upper side of the semiconductor substrate with a mask so as to form the photoelectric conversion layers.

* * * * *